United States Patent
Ju et al.

(10) Patent No.: US 11,915,637 B2
(45) Date of Patent: *Feb. 27, 2024

(54) GATE DRIVER AND DISPLAY DEVICE COMPRISING SAME

(71) Applicant: LG DISPLAY CO., LTD., Seoul (KR)

(72) Inventors: SeongHwan Ju, Paju-si (KR);
JinYeong Kim, Goyang-si (KR);
HyeonHo Son, Goyang-si (KR);
Hyunwoo Kim, Bucheon-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/776,562

(22) PCT Filed: Sep. 1, 2020

(86) PCT No.: PCT/KR2020/011687
§ 371 (c)(1),
(2) Date: May 12, 2022

(87) PCT Pub. No.: WO2021/132839
PCT Pub. Date: Jul. 1, 2021

(65) Prior Publication Data
US 2022/0406248 A1 Dec. 22, 2022

(30) Foreign Application Priority Data
Dec. 23, 2019 (KR) .......................... 10-2019-0172697

(51) Int. Cl.
*G09G 3/32* (2016.01)
*G09G 3/3266* (2016.01)

(52) U.S. Cl.
CPC .............. *G09G 3/32* (2013.01); *G09G 3/3266* (2013.01); *G09G 2300/0408* (2013.01);
(Continued)

(58) Field of Classification Search
CPC .................. G09G 3/32; G09G 3/3266; G09G 2300/0408; G09G 2300/0452;
(Continued)

(56) References Cited

U.S. PATENT DOCUMENTS 9,754,535 B2 9/2017 Ohara et al.
10,127,859 B2 11/2018 Chang et al.
(Continued)

FOREIGN PATENT DOCUMENTS

CN 105074808 A 11/2015
CN 107146575 A 9/2017
(Continued)

OTHER PUBLICATIONS

PCT International Search Report and Written Opinion, PCT Application No. PCT/KR2020/011687, dated Nov. 25, 2020, 10 pages.
(Continued)

*Primary Examiner* — Kenneth B Lee, Jr.
(74) *Attorney, Agent, or Firm* — Fenwick & West LLP

(57) ABSTRACT

According to an aspect of the present disclosure, there is provided a display device including a plurality of unit pixels comprising a main pixel and a redundancy pixel which emit a same color; and a gate driver integrated in each of the plurality of unit pixels and comprising a plurality of stages, wherein each of the plurality of stages comprises a scan driving circuit for outputting a first scan signal and a second scan signal; and an emission driving circuit for outputting an emission control signal, wherein an output timing of the first scan signal supplied to the main pixel is the same as an output timing of the first scan signal supplied to the redundancy pixel, and wherein an output timing of the second scan signal supplied to the main pixel is different from an output timing of the second scan signal supplied to the redundancy pixel.

16 Claims, 25 Drawing Sheets

(52) U.S. Cl.
CPC ............... *G09G 2300/0452* (2013.01); *G09G 2300/0819* (2013.01); *G09G 2300/0842* (2013.01); *G09G 2300/0861* (2013.01); *G09G 2310/08* (2013.01); *G09G 2330/08* (2013.01)

(58) Field of Classification Search
CPC ... G09G 2300/0819; G09G 2300/0842; G09G 2300/0861; G09G 2310/08; G09G 2330/08
See application file for complete search history.

(56) References Cited

U.S. PATENT DOCUMENTS

| | | | |
|---|---|---|---|
| 10,223,969 B2 | 3/2019 | Park et al. | |
| 10,559,261 B2 | 2/2020 | Chang et al. | |
| 11,514,834 B2 | 11/2022 | Jeong et al. | |
| 2010/0188381 A1* | 7/2010 | Jang | G09G 3/3266 345/76 |
| 2015/0170595 A1* | 6/2015 | Chen | G09G 3/3696 345/212 |
| 2016/0012774 A1 | 1/2016 | Ohara et al. | |
| 2017/0004760 A1* | 1/2017 | Jang | G09G 3/3677 |
| 2017/0092199 A1 | 3/2017 | Park et al. | |
| 2018/0190197 A1* | 7/2018 | Chang | G09G 3/3233 |
| 2019/0051247 A1 | 2/2019 | Chang et al. | |
| 2020/0159054 A1* | 5/2020 | Jeong | G02F 1/13336 |
| 2020/0286972 A1* | 9/2020 | Seo | H10K 59/1213 |
| 2022/0375401 A1* | 11/2022 | Kim | G09G 3/3258 |

FOREIGN PATENT DOCUMENTS

| | | |
|---|---|---|
| CN | 108257549 A | 7/2018 |
| CN | 114830217 A | 7/2022 |
| EP | 4080497 A1 | 10/2022 |
| KR | 10-2010-0021130 A | 2/2010 |
| KR | 10-2011-0090331 A | 8/2011 |
| KR | 10-2017-0115182 A | 10/2017 |
| KR | 10-2017-0128770 A | 11/2017 |
| KR | 10-2018-0121292 A | 11/2018 |
| KR | 10-2019-0018932 A | 2/2019 |
| KR | 10-2019-0021985 A | 3/2019 |

OTHER PUBLICATIONS

European Patent Office, Extended European Search Report, European Patent Application No. 20907017.6, dated Nov. 20, 2023, 13 pages.

China National Intellectual Property Administration, Office Action, Chinese Patent Application No. 202080078133.4, dated Dec. 18, 2023, 17 pages.

* cited by examiner

GATE DRIVER AND DISPLAY DEVICE COMPRISING SAME

TECHNICAL FIELD

The present disclosure relates to a gate driver and a display device including the same, and more particularly, to a display device including a gate driver capable of driving both a main pixel and a redundancy pixel.

BACKGROUND ART

Liquid-crystal display devices (LCDs) and organic light-emitting display devices (OLEDs), which have been widely used up to now, find more and more applications.

Liquid-crystal display devices and organic light-emitting display devices are widely employed as the screen of typical electronic devices such as mobile phones and laptop computers because they can provide high resolution image and can be made thin and light.

Unfortunately, liquid-crystal display devices and organic light-emitting display devices include a bezel that is seen by a viewer and does not display image, and thus the display area is reduced by the size of the bezel. For example, a liquid-crystal display device requires a sealant used to seal the liquid-crystal molecules and to attach the upper substrate and the lower substrate together, and thus there is a limitation in decreasing the size of the bezel. In addition, an organic light-emitting display device requires an encapsulation layer to protective organic light-emitting diodes since the organic light-emitting diodes are made of an organic material and thus are very vulnerable to moisture or oxygen. Accordingly, there is a limitation in decreasing the size of the bezel. In particular, it is impossible to implement an extra-large screen with a single panel, and thus an extra-large screen is implemented with a plurality of liquid-crystal display panels or a plurality of organic display panels in the form of tiles. In such a screen, there may be a problem that the bezel between adjacent panels is seen by a user.

As an alternative to this, a display device including LEDs has been proposed. An LED is made of an inorganic material instead of an organic material, and therefore has excellent reliability and a longer lifetime than a liquid-crystal display device or an organic display device. In addition, the LEDs can be turned on and off quickly, consume less power, are robust to impact resistance and stable, and can display a high-brightness image. Accordingly, LEDs are advantageous for large screens.

For these reasons, LEDs are generally used in a display device for providing an extra-large screen with the reduced bezel.

DISCLOSURE

Technical Problem

The inventors of the application have appreciated that LEDs have better luminous efficiency than organic light-emitting diodes, and thus the size of a single pixel, i.e., the size of an emission area required to emit light of the same luminance in a display device including LEDs is much smaller than that of a display device including organic light-emitting elements. Accordingly, the inventors of the application have found that, in a display device implemented using LEDs, the distance between the emission areas of adjacent pixels is much greater than the distance between the emission areas of adjacent pixels in an organic display device having the same resolution. In view of the above, the inventors of the application have appreciated that in a tiling display implemented by using a plurality of display panels arranged in the form of tiles, the distance between the outermost LED of one display panel and the outermost LED of an adjacent display panel can be equal to the distance between LEDs in a single display panel, and thus it is possible to implement a zero-bezel display device where substantially no bezel is formed. In order to implement such a tiling display, however, a variety of drivers, such as a gate driver and a data driver, should be located on the lower surface of the display panel instead of the upper surface.

To this end, the inventors of the application have devised a display device having a novel structure in which elements such as thin-film transistors and LEDs are disposed on the upper surface of the display panel, and drivers such as a gate driver and a data driver are disposed on the lower surface of the display panel.

Unfortunately, the inventors of the application have recognized that the defect rate of the process is increased in the display device having the above-described structure. Specifically, a process of forming a connection element for connecting the elements such as thin-film transistors and the LEDs formed on the upper surface of the display panel with the drivers such as a gate driver and a data driver formed on the lower surface of the display panel is added, thereby increasing the defect rate.

In view of the above, the inventors of the application have devised a display device having a novel structure in which the above-described additional process is simplified.

In view of the above, an object of the present disclosure is to provide a display device in which gate drivers are disposed on both sides of the upper surface of the display panel and thus no connection element is required on the both side of the display panel, to reduce the number of additional processes.

Another object of the present disclosure is to provide a display device in which a gate driver can drive a main pixel as well as a redundancy pixel.

Another object of the present disclosure is to provide a zero-bezel display device in which a gate driver is integrated in a pixel.

Objects of the present disclosure are not limited to the above-mentioned objects, and other objects, which are not mentioned above, can be clearly understood by those skilled in the art from the following descriptions.

Technical Solution

According to an aspect of the present disclosure, there is provided a display device including a plurality of unit pixels comprising a main pixel and a redundancy pixel which are emitting a same color; and a gate driver integrated in each of the plurality of unit pixels and comprising a plurality of stage, wherein each of the plurality of stage comprises a scan driving circuit for outputting a first scan signal and a second scan signal; and an emission driving circuit for outputting an emission control signal, wherein an output timing of the first scan signal supplied to the main pixel is same as an output timing of the first scan signal supplied to the redundancy pixel, and wherein an output timing of the second scan signal supplied to the main pixel is different from an output timing of the second scan signal supplied to the redundancy pixel.

Other matters of the exemplary embodiments are included in the detailed description and the drawings.

Advantageous Effects

According to an exemplary embodiment of the present disclosure, it is not necessary to form a side line to connecting to a gate driver, and thus the probability of a defect occurring via the process of forming the side line is significantly reduced.

According to an exemplary embodiment of the present disclosure, by disposing the main pixel and the redundancy pixel inside a unit pixel, even if the main pixel becomes defective, the redundancy pixel can emit light instead of the main pixel, so that the reliability of the display device is improved.

According to an exemplary embodiment of the present disclosure, the non-display area can be eliminated by disposing a gate driver inside the unit pixel, thereby achieving a zero-bezel display.

The effects according to the present disclosure are not limited to the contents exemplified above, and more various effects are included in the present specification.

MODES OF THE INVENTION

Figure 1:
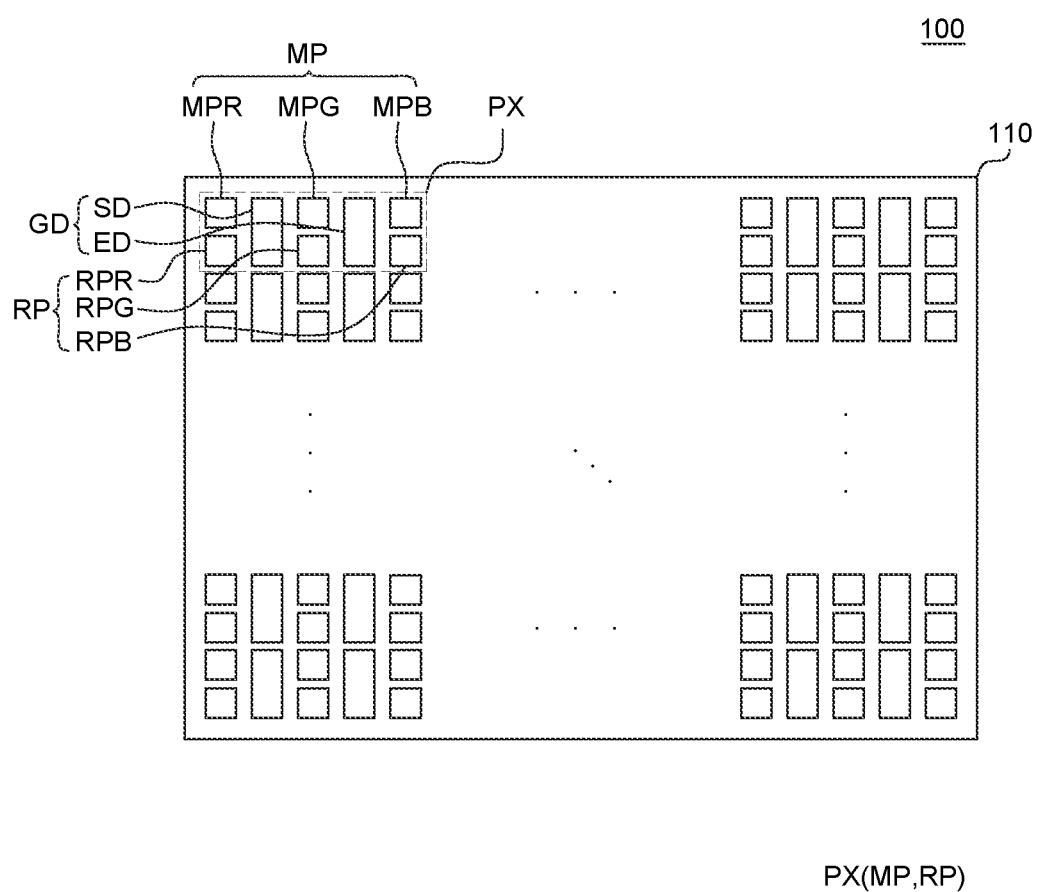
FIG. 1 is a top view showing a display device according to an exemplary embodiment.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Same reference numerals generally denote same elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a gate driver and a display device including the same according to exemplary embodiments of the present disclosure will be described in detail with reference to accompanying drawings.

FIG. 1 is a top view showing a display device according to an exemplary embodiment.

Referring to FIG. 1, a display device 100 includes a display panel 110 including a plurality of unit pixels PX connected to gate lines and data lines, gate driver GD supplying gate signals to each of the gate lines, and a data driver supplying a data signal to each of the data lines.

The display panel 110 includes a plurality of unit pixels PX, and each of the unit pixels PX includes main pixels MP and redundancy pixels RP.

The main pixels MP are for representing grayscale images, and the redundancy pixels RP are for operating when a defect occurs in the main pixels MP. It should be understood, however, that the present disclosure is not limited thereto. The main pixels MP and the redundancy pixels RP of the display device 100 may simultaneously emit light. For example, when any of the main pixels MP fails to represent a desired grayscale value due to problems such as lifespan and aging, the respective redundancy pixel RP may further emit light.

In addition, the main pixels MP and the redundancy pixels RP are arranged in lines in each of the unit pixels PX of the display panel 110, and the main pixels MP and the redundancy pixels RP are arranged adjacent to each other.

Specifically, the main pixels MP are disposed in odd-numbered rows of the unit pixel PX. In addition, the main pixels MP include elements that emit light of different colors. For example, the main pixels MP include a red main pixel MPR, a green main pixel MPG, and a blue main pixel MPB.

In addition, the redundancy pixels RP are disposed in even-numbered rows of the unit pixel PX. The redundancy pixels RP emit lights of the same colors as the respective main pixels MP. For example, the redundancy pixels RP include a red redundancy pixel RPR, a green redundancy pixel RPG, and a blue redundancy pixel RPB.

The red main pixel MPR is disposed in line with the red redundancy pixel RPR, the green main pixel MPG is disposed in line with the green redundancy pixel RPG, and the blue main pixel MPB is disposed in line with the blue redundancy pixel RPB.

It should be understood, however, that the present disclosure is not limited thereto. The main pixels MP and the redundancy pixels RP may further include a main pixel representing white and a redundancy pixel representing white, respectively. The type and number of the main pixels MP and the redundancy pixels RP may vary depending on exemplary embodiments.

The plurality of main pixels MP and the plurality of redundancy pixels RP disposed on the display panel 110 may be spaced apart from each other by different distances. For example, in FIG. 1, each of the plurality of unit pixels PX include a plurality of main pixels MP and a plurality of redundancy pixels RP arranged in parallel in two lines, and the main pixels MP and the redundancy pixels RP are spaced apart from each other by the same distance in each unit pixel PX. However, the distance between the main pixels MP and the redundancy pixels RP disposed with the boundary of the unit pixels PX therebetween may be different from the distance between the main pixels MP and the redundancy pixels RP disposed in the unit pixel PX. It should be understood, however, that the present disclosure is not limited thereto. The main pixels MP and the redundancy pixels RP may be arranged at the same distance from each other in the entire area of the display panel 110.

As described above, since the main pixels MP and the redundancy pixels RP are disposed in the unit pixel PX, even if any of the main pixels MP becomes defective, the respective redundancy pixel RP may emit light in place of the main pixel MP. As a result, the reliability of the display device 100 can be improved, and the emission time of the display device 100 can be increased.

In each of the main pixels MP and the redundancy pixels RP, an LED serving as a light-emitting element and a pixel circuit for driving the light-emitting element are disposed.

Although the LED is used as the light-emitting element herein, the present disclosure is not limited thereto. An organic light-emitting element, a quantum-dot element, etc. may also be used as the light-emitting element.

Each of the plurality of main pixels MP and the plurality of redundancy pixels RP receives gate signals from the gate drivers GD through the gate lines, receives data signals from the data driver through the data lines, and receives a variety of voltages through a power supply line.

Specifically, as will be described later with reference to FIG. 3, each of the plurality of main pixels MP and the plurality of redundancy pixels RP receives a first scan signal SCAN1, a second scan signal SCAN2 and an emission control signal EM through the gate line, receives a data signal VDATA through the data line, and receives a pixel-high voltage VDD, a pixel-low voltage VSS, and an initializing voltage VREF through the power supply line.

Incidentally, when a tiling display is implemented by using the display device 100 according to an exemplary embodiment of the present disclosure, the distance between the outermost unit pixel PX of one display panel and the outermost unit pixel PX of an adjacent display panel can be equal to the distance between the unit pixels PX in a single display panel. Thus, it is possible to implement a zero-bezel where substantially no bezel is formed. Accordingly, the display device 100 may be defined as having only a display area and a non-display area may be described as not defined in the display device 100.

The gate drivers GD supply gate signals to the plurality of unit pixels PX through the gate lines. The gate signals include the first scan signal SCAN1, the second scan signal SCAN2 and the emission control signal EM.

Specifically, each of the gate drivers GD may include a plurality of cascaded stages, and each of the stages may include a scan driving circuit SD that outputs the first scan signal SCAN1 and the second scan signal SCAN2, and an emission driving circuit ED that outputs an emission control signal EM.

The gate drivers GD may be formed on the upper surface of the display panel 110. Specifically, in the display device 100 according to the exemplary embodiment of the present disclosure, since the luminous efficiency of the LED, which is the light-emitting element, is excellent, the area of the unit pixel PX that is occupied by the LED may be very small. Accordingly, the gate driver GD may be disposed in one unit pixel PX in addition to the LEDs as the light-emitting elements and the pixel circuit for driving the LEDs. In other words, in the display device according to the exemplary embodiment of the present disclosure, the gate driver GD may be integrated in the unit pixel PX. That is to say, the gate driver GD may be integrated in the unit pixel PX in a GIA (Gate In Active area) fashion.

That is to say, as shown in FIG. 1, the gate driver GD may be disposed between the main pixels MP and between the redundancy pixels RP forming the unit pixel PX. More specifically, the scan driving circuit SD of the gate driver GD may be disposed between the red main pixel MPR and the green main pixel MPG or between the red redundancy pixel RPR and the green redundancy pixel RPG. The emission driving circuit ED of the gate driver GD may be disposed between the blue main pixel MPB and the green main pixel MPG or between the blue redundancy pixel RPB and the green redundancy pixel RPG.

The data driver converts the image data into the data signal VDATA, and supplies the converted data signal VDATA to the unit pixel PX through the data line.

In addition, the data driver may be formed on the lower surface of the display panel 110.

Specifically, in order to connect the unit pixel PX disposed on the upper surface of the display panel 110 with the data driver disposed on the lower surface of the display panel 110, a side line is formed on the side surface of the display panel 110. In addition, the data driver may be disposed on one side of the lower surface of the display panel 110 and may supply the data signal VDATA to the unit pixel PX through the side line.

As described above, the gate driver may be integrated in the unit pixel PX in a GIA (Gate In Active area) fashion on the upper surface of the display panel in the display device 100 according to the exemplary embodiment of the present disclosure. On the contrary, the data driver may be disposed on the lower surface of the display panel.

In the display device 100 according to the exemplary embodiment of the present disclosure, it is not required to form such a side line in order to connecting to the gate driver GD, the probability of a defect occurring via a process of forming the side line is significantly reduced. As a result, the process yield of the display device 100 according to the exemplary embodiment of the present disclosure can be improved.

In addition, since the gate driver GD is integrated in the unit pixel PX, a non-display area is not defined, achieving a zero bezel.

Hereinafter, a connection relationship between the gate driver GD and a plurality of unit pixels PX and a signal input and output relationship will be described in detail in the display device 100 according to an exemplary embodiment with reference to FIG. 2.

Figure 2:
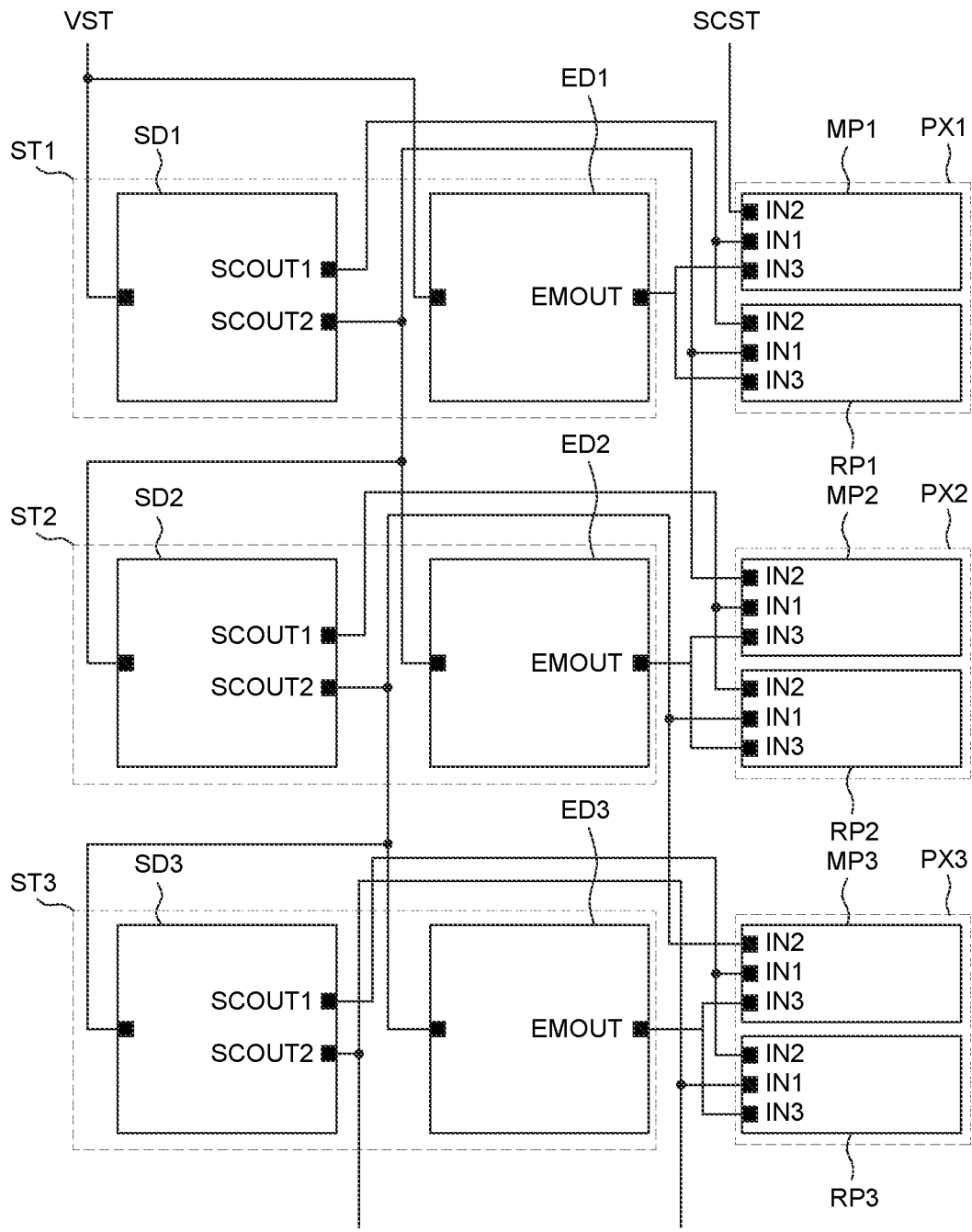
FIG. 2 is a block diagram of a gate driver and a plurality of unit pixels of a display device according to an exemplary embodiment.

FIG. 2 is a block diagram of a gate driver and a plurality of unit pixels of a display device according to an exemplary embodiment.

Referring to FIG. 2, in the display device according to the exemplary embodiment of the present disclosure, the gate driver GD includes a plurality of cascaded stages ST1, ST2 and ST3, and a plurality of unit pixels PX1, PX2 and PX3 is disposed corresponding to the plurality of stages ST1, ST2 ST3, respectively. Although three stages ST1, ST2 and ST3 and three unit pixels PX1, PX2 and PX3 are shown in FIG. 2 for convenience of illustration, the number of stages and the number of unit pixels are not limited thereto. More or less stages and/or unit pixels may be disposed.

That is to say, the plurality of stages ST1, ST2 and ST3 may respectively include scan driving circuits SD1, SD2 and SD3 each outputting the first scan signal SCAN1 and the second scan signal SCAN2, and emission driving circuits ED1, ED2 and ED3 each outputting the emission control signal EM.

The first main pixel MP1 and the first redundancy pixel RP1 may be associated with the first stage ST1, the second main pixel MP2 and the second redundancy pixel RP2 may be associated with the second stage ST2, and the third main pixel MP3 and the third redundancy pixel RP3 may be associated with the third stage ST3.

Each of the plurality of scan driving circuits SD1 SD2 and SD3 may include a first scan output unit terminal SCOUT1 outputting the first scan signal SCAN1, and a second scan output unit terminal SCOUT2 outputting the second scan signal SCAN2. Each of the plurality of emission driving circuits ED1, ED2 and ED3 may include an emission output unit terminal EMOUT outputting an emission control signal EM. In addition, each of the plurality of main pixels MP1, MP2 and MP3 and the plurality of redundancy pixels RP1, RP2 and RP3 may include a first input terminal IN1, a second input terminal IN2 and a third input terminal IN3 receiving the first scan signal SCAN1, the second scan signal SCAN2, and the emission control signal EM, respectively.

The first scan output unit terminal SCOUT1 of the nth stage is connected to the first input terminal IN1 of the nth main pixel and the second input terminal IN2 of the nth redundancy pixel, where n is a natural number. Accordingly, the first scan signal SCAN1 output from the scan driving circuit of the nth stage is applied to the first input terminal IN1 of the nth main pixel and the second input terminal IN2 of the nth redundancy pixel.

In addition, the second scan output unit terminal SCOUT2 of the nth stage is connected to the first input terminal IN1 of the nth redundancy pixel, is connected to the scan driving circuit and the emission driving circuit of the (n+1)th stage, and is connected to the second input terminal IN2 of the (n+1)th main pixel. Accordingly, the second scan signal SCAN2 output from the scan driving circuit of the nth stage is applied to the first input terminal IN1 of the nth redundancy pixel, is applied to the scan driving circuit and the emission driving circuit of the (n+1)th stage, and is applied to the second input terminal IN2 of the (n+1)th main pixel.

In addition, the emission output unit terminal EMOUT of the nth stage is connected to the third input terminal IN3 of the nth main pixel and the third input terminal IN3 of the nth redundancy pixel. Accordingly, the emission control signal EM output from the emission driving circuit of the nth stage is applied to the third input terminal IN3 of the nth main pixel and the third input terminal IN3 of the nth redundancy pixel.

The nth main pixel and the nth redundancy pixel will be described again. Since the first scan signal SCAN1 output from the scan driving circuit of the nth stage is supplied to the first input terminal IN1 of the nth main pixel and the second input terminal IN2 of the nth redundancy pixel, the output timing of the first scan signal SCAN1 supplied to the nth main pixel may be the same as the output timing of the first scan signal SCAN1 supplied to the nth redundancy pixel.

On the other hand, the second scan signal SCAN2 output from the scan driving circuit of the (n−1)th stage is supplied to the second input terminal IN2 of the nth main pixel, and the second scan signal SCAN2 output from the scan driving circuit of the nth stage is supplied to the first input terminal IN1 of the nth redundancy pixel. Accordingly, the output timing of the second scan signal SCAN2 supplied to the nth main pixel may be different from the output timing of the second scan signal SCAN2 supplied to the nth redundancy pixel.

This will be described with reference to the example of FIG. 2. The first scan output unit terminal SCOUT1 of the second scan driving circuit SD2 is connected to the first input terminal IN1 of the second main pixel MP2 and the second input terminal IN2 of the second redundancy pixel RP2. Accordingly, the first scan signal SCAN1 output from the second scan driving circuit SD2 is applied to the first input terminal IN1 of the second main pixel MP2 and the second input terminal IN2 of the second redundancy pixel RP2.

In addition, the second scan output unit terminal SCOUT2 of the second scan driving circuit SD2 is connected to the first input terminal IN1 of the second redundancy pixel RP2, is connected to the third scan driving circuit SD3 and the third emission driving circuit ED3, and is connected to the second input terminal IN2 of the third main pixel MP3. Accordingly, the second scan signal SCAN2 output from the second scan driving circuit SD2 is applied to the first input terminal IN1 of the second redundancy pixel RP2, applied to the third scan driving circuit SD3 and the third emission driving circuit ED3, and applied to the second input terminal IN2 of the third main pixel MP3.

In addition, the emission output unit terminal EMOUT of the second stage is connected to the third input terminal IN3 of the second main pixel MP2 and the third input terminal IN3 of the second redundancy pixel RP2. Accordingly, the emission control signal EM output from the second emission driving circuit ED2 is applied to the third input terminal IN3 of the second main pixel MP2 and the third input terminal IN3 of the second redundancy pixel RP2.

In addition, the first scan driving circuit SD1 and the emission driving circuit ED1 may receive the gate start signal VST separately, and the second input terminal IN2 of the first main pixel MP1 may receive the start clock signal SCSI separately. The above-described start clock signal SCST may be identical to the gate start signal VST, but the present disclosure is not limited thereto.

Hereinafter, an example where a display device according to an exemplary embodiment includes a 6T1C pixel circuit will be described in detail with reference to FIG. 3.

Transistors to be described below may be implemented as transistors having an n-type or p-type MOSFET structure. Although p-type transistors will be described in the following description, it is to be understood that the present disclosure is not limited thereto.

Figure 3:
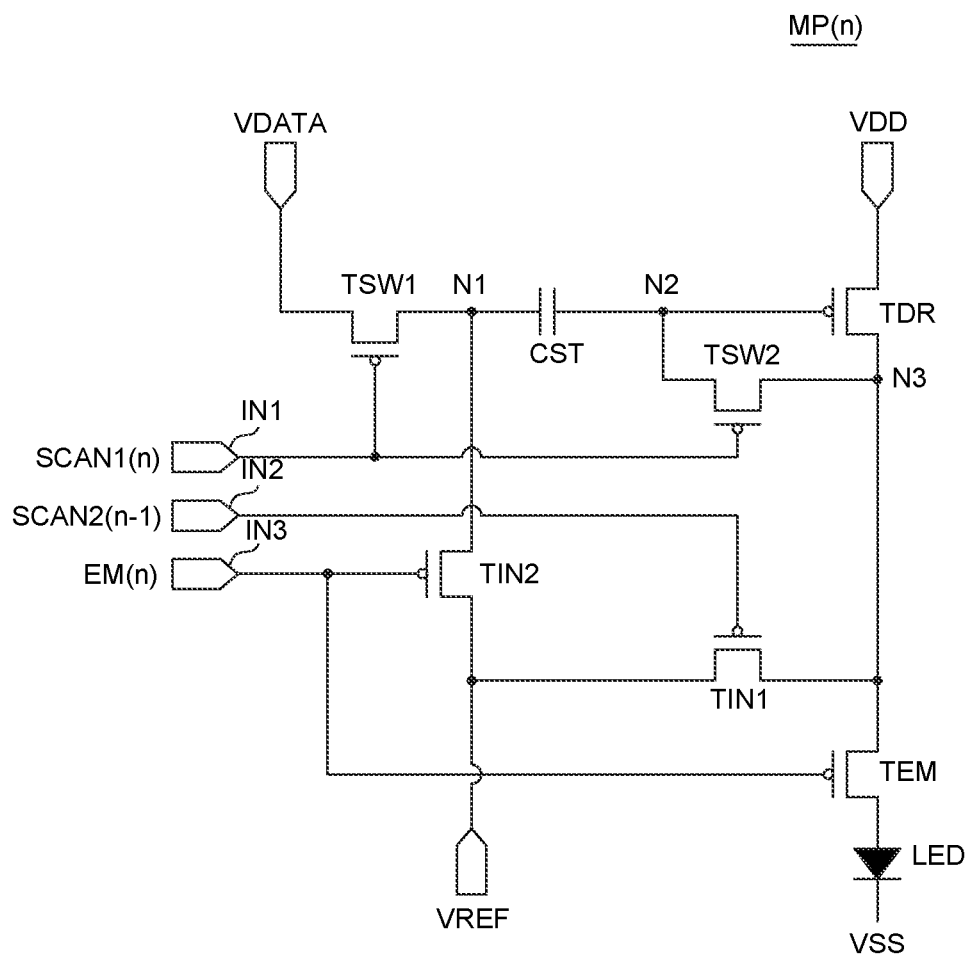
FIG. 3 is a circuit diagram showing a pixel circuit included in a display device according to an exemplary embodiment.

FIG. 3 is a circuit diagram showing a pixel circuit included in a display device according to an exemplary embodiment.

Transistors to be described below may be implemented as transistors having an n-type or p-type MOSFET structure. Although p-type transistors will be described in the following description, it is to be understood that the present disclosure is not limited thereto.

Additionally, each of the transistors is a three-electrode device including a gate electrode, a source electrode, and a drain electrode. The source electrode is used to supply carriers to the transistor. In the transistors, carriers begin to flow from the source electrode. The carriers exit via the drain electrode of the transistor. In other words, the carriers flow from the source electrode to the drain electrode in the MOSFET. For an n-type MOSFET (NMOS) where electrons are carriers, the voltage at the source electrode is lower than the voltage at the drain electrode to allow the electrons to flow from the source electrode to the drain electrode. As the electrons flow from the source electrode to the drain electrode in the n-type MOSFET, electric current flows from the drain electrode to the source electrode. For a p-type MOSFET (PMOS) where holes are carriers, the voltage at the source electrode is higher than the voltage at the drain electrode to allow the holes to flow from the source electrode to the drain electrode. As the holes flow from the source electrode to the drain electrode in the p-type MOSFET, electric current flows from the source electrode to the drain electrode. It is to be noted that the source and drain electrodes of the MOSFET are not fixed. For example, the source electrode and the drain electrode of the MOSFET can be switched depending on the applied voltage. In the following description, the present disclosure is not limited by the source and drain electrodes of the transistor.

In the following description, the source electrode of a transistor is referred to as a first electrode, and the drain electrode of the transistor is referred to as a second electrode. It is to be noted that the source electrode of a transistor may be referred to as a second electrode, and the drain electrode of the transistor may be referred to as a first electrode depending on the type of transistor.

Referring to FIG. 3, the main pixel MP(n) of the display device according to an exemplary embodiment of the present disclosure includes a driving transistor TDR, a first switching transistor TSW1, a second switching transistor TSW2, an emission control transistor TEM, a first initializing transistor TIN1, a second initializing transistor INT2, and a storage capacitor CST.

The driving transistor TDR drives an LED. In the driving transistor TDR, the pixel high level voltage VDD is applied to the first electrode, the second electrode is connected to a third node N3, and the gate electrode is connected to a second node N2. Accordingly, the luminance of the LED is controlled by controlling the driving current supplied to the LED and the driving voltage according to the gate-source voltage Vgs of the driving transistor TDR.

The first switching transistor TSW1 applies the data voltage VDATA supplied from the data line to a first node N1. In the first switching transistor TSW1, the data voltage VDATA is input to the first electrode, the second electrode is connected to the first node N1, and the gate electrode is connected to the first input terminal IN1.

Referring to FIG. 2, as described above, the first scan signal SCAN1(n) output from the scan driving circuit SD(n) of the nth stage is applied to the first input terminal IN1 of the nth main pixel MP(n).

Accordingly, the first switching transistor TSW1 applies the data voltage VDATA supplied from the data line to the first node N1 in response to the first scan signal SCAN1(n).

The second switching transistor TSW2 samples the threshold voltage Vth of the driving transistor TDR. In the second switching transistor TSW2, the first electrode is connected to the third node N3, the second electrode is connected to the second node N2, and the gate electrode is connected to the first input terminal IN1.

Accordingly, the second switching transistor TSW2 electrically connects the second node N2 with the third node N3 to diode-connect the gate electrode with the second electrode of the driving transistor TDR in response to the first scan signal SCAN1(n). Accordingly, by the second switching transistor TSW2, the voltage of the second node N2 increases along with the voltage of the third node N3. As the voltage of the second node N2 increases, the gate-source voltage difference Vgs of the driving transistor TDR gradually decreases, and the driving transistor TDR is turned off when the gate-source voltage difference of the driving transistor TDR becomes less than the threshold voltage Vth. Through the above-described process, the second switching transistor TSW2 may sample the threshold voltage Vth of the driving transistor TDR.

The emission control transistor TEM controls the emission of the LED. In the emission control transistor TEM, the first electrode is connected to the third node N3, the second electrode is connected to the LED, and the gate electrode is connected to the third input terminal IN3.

Referring to FIG. 2, as described above, the emission control signal EM(n) output from the emission driving circuit ED(n) of the nth stage is applied to the third input terminal IN3 of the nth main pixel MP(n).

Accordingly, the emission control transistor TEM may form a current path between the third node N3 and the LED in response to the emission control signal EM(n) to allow the LED to emit light.

The first initializing transistor TIN1 applies the initializing voltage VREF to the third node N3.

In the first initializing transistor TIN1, the initializing voltage VREF is applied to the first electrode, the second electrode is connected to the third node N3, and the gate electrode is connected to the second input terminal.

Referring to FIG. 2, as described above, the second scan signal SCAN2(n−1) output from the scan driving circuit SD(n−1) of the (n−1)th stage is applied to the second input terminal IN2 of the nth main pixel MP(n).

Accordingly, the first initializing transistor TIN1 applies the initializing voltage VREF to the third node N3 in response to the second scan signal SCAN2(n−1).

The second initializing transistor INT2 applies the initializing voltage VREF to the first node N1. In the second initialization transistor INT2, the initializing voltage VREF is applied to the first electrode, the second electrode is connected to the first node N1, and the third input terminal IN3 is connected to the gate electrode.

Accordingly, the second initializing transistor INT2 applies the initializing voltage VREF to the first node N1 in response to the emission control signal EM(n).

The storage capacitor CST stores a voltage applied to a gate node of the driving transistor TDR.

The capacitor CST is disposed between the first node N1 and the second node N2.

Accordingly, the storage capacitor CST is electrically connected to the first node N1 and the second node N2 to store the difference between the voltage of the gate electrode of the driving transistor TDR and the voltage supplied to the second electrode of the first switching transistor TSW1.

Hereinafter, a driving scheme of a main pixel of the display device according to the exemplary embodiment of the present disclosure will be described in detail with reference to FIGS. 4A to 8B. In FIGS. 4A to 8A, a turned-off transistor is indicated by a dotted line, while a turned-on transistor is indicated by a solid line.

As described above, since the transistors are p-type transistors, each of the transistors is turned on when a low-level voltage is applied to its gate electrode. Accordingly, the low-level voltage will be described as a turn-on level voltage, and the high-level voltage will be described as a turn-off level voltage. It should be understood, however, that the present disclosure is not limited thereto. When the transistors are n-type transistors, the turn-on level voltage may be a high-level voltage, while the turn-off level voltage may be a low-level voltage.

Figure 4A:
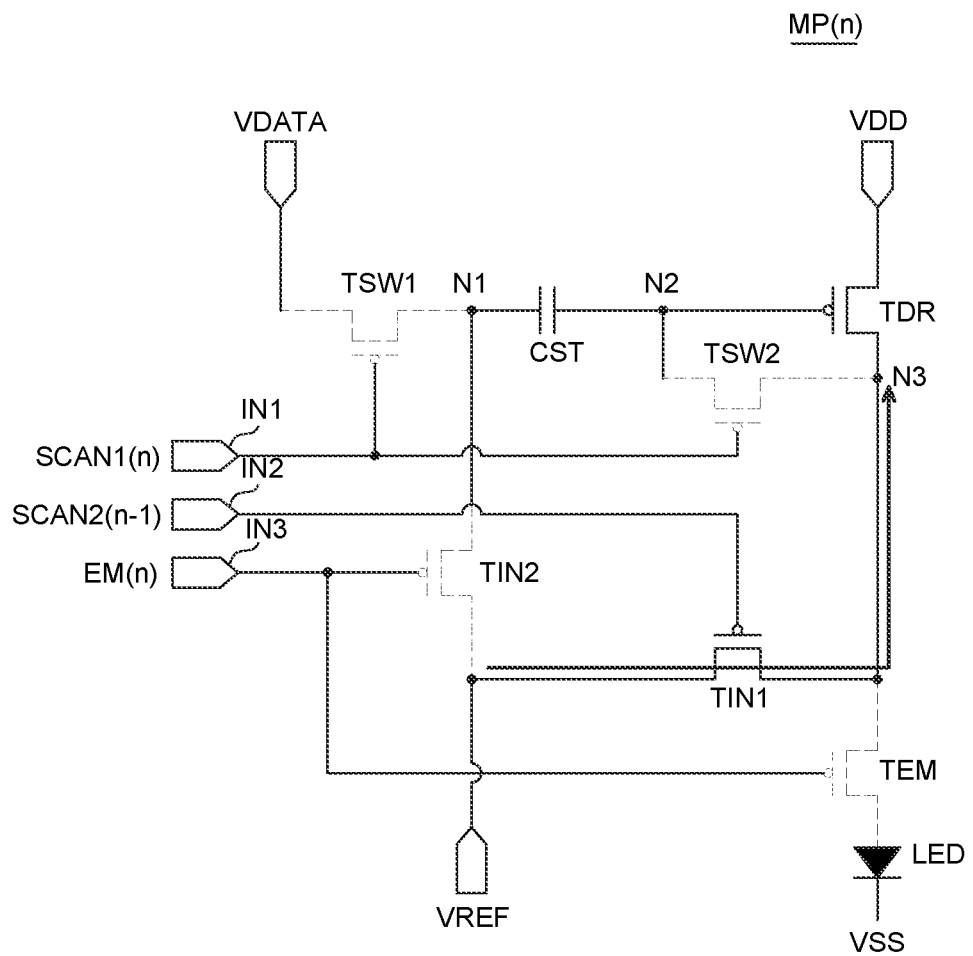
FIG. 4A is a circuit diagram for illustrating a first driving period of a main pixel of a display device according to an exemplary embodiment.

FIG. 4A is a circuit diagram for illustrating a first driving period of a main pixel of a display device according to an exemplary embodiment.

Figure 4B:
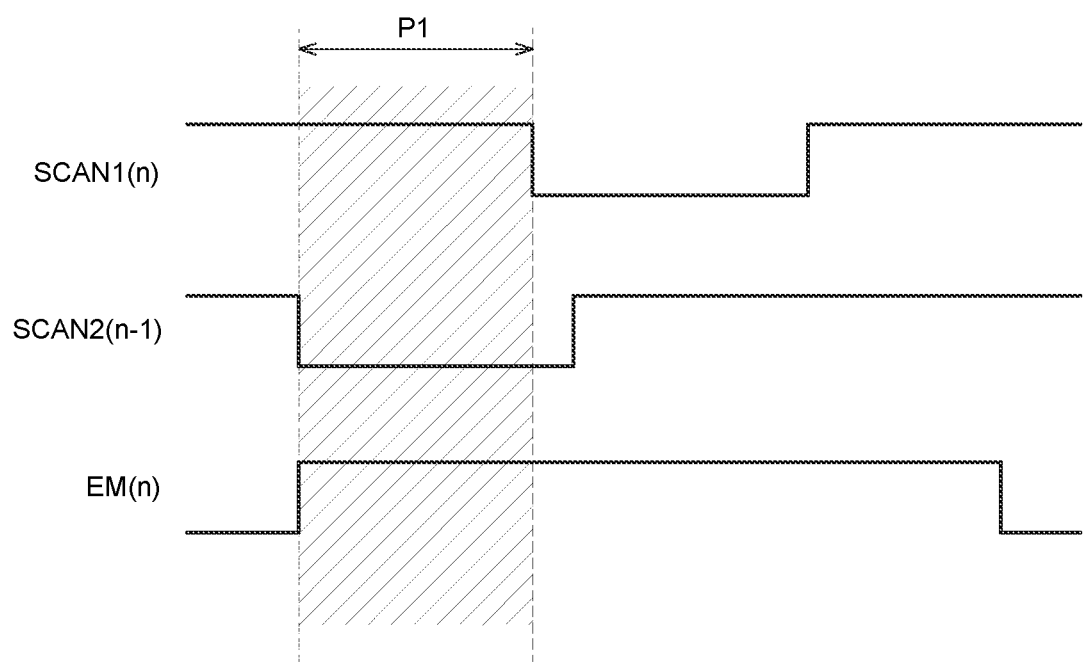
FIG. 4B is a timing diagram for illustrating the first driving period of the main pixel of the display device according to the exemplary embodiment.

FIG. 4B is a timing diagram for illustrating the first driving period of the main pixel of the display device according to the exemplary embodiment.

As shown in FIG. 4B, during the first driving period P1, the first scan signal SCAN1(n) is at a turn-off level, the second scan signal SCAN2(n−1) is at a turn-on level, and the emission control signal EM(n) is at the turn-off level.

Accordingly, as shown in FIG. 4A, in the first driving period P1, the first initializing transistor TIN1 is turned on by the second scan signal SCAN2(n−1), and the initializing voltage VREF is applied to the third node N3.

Figure 5A:
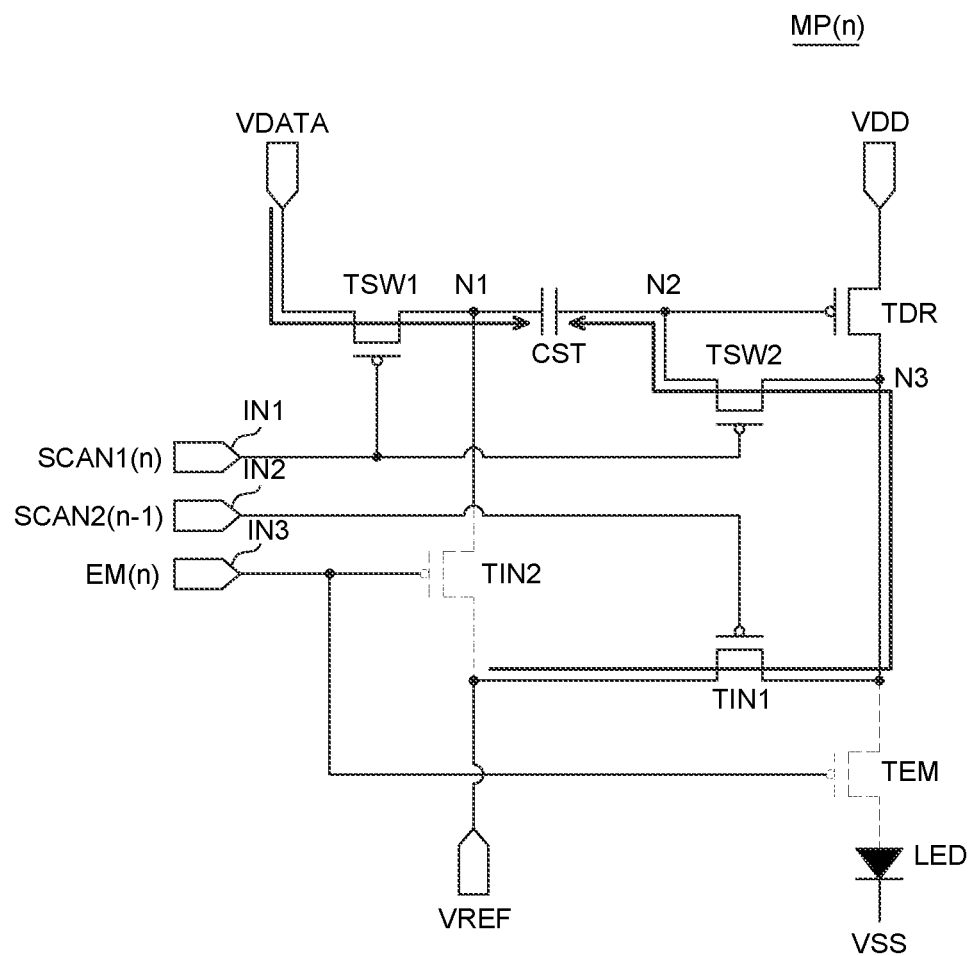
FIG. 5A is a circuit diagram for illustrating a second driving period of the main pixel of the display device according to the exemplary embodiment.

FIG. 5A is a circuit diagram for illustrating a second driving period of the main pixel of the display device according to the exemplary embodiment.

Figure 5B:
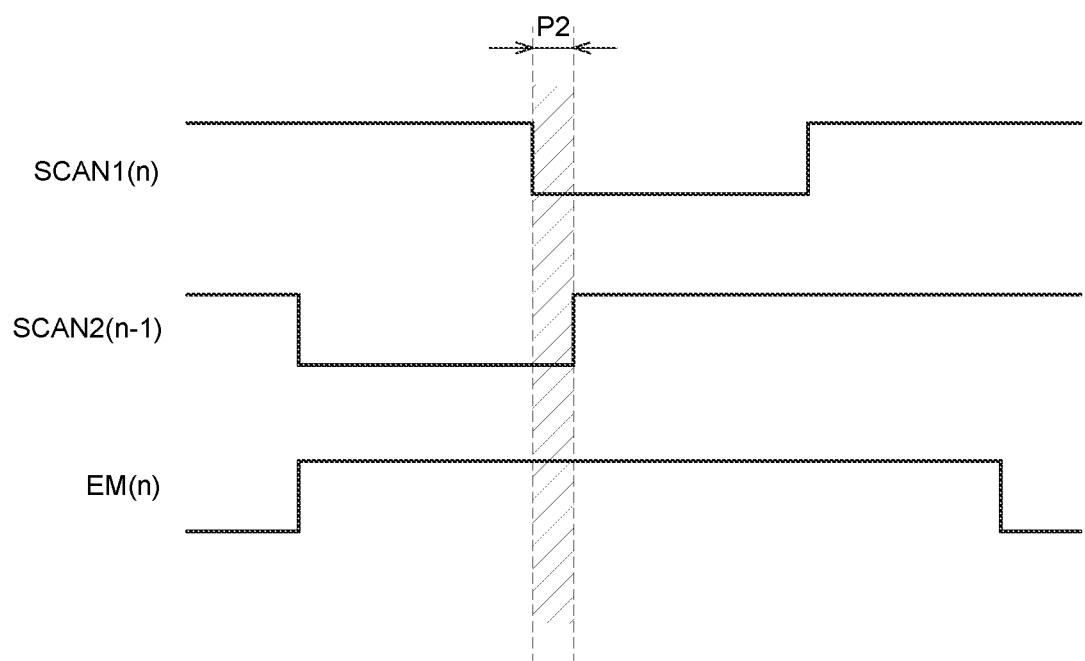
FIG. 5B is a timing diagram for illustrating the second driving period of the main pixel of the display device according to the exemplary embodiment.

FIG. 5B is a timing diagram for illustrating the second driving period of the main pixel of the display device according to the exemplary embodiment.

As shown in FIG. 5B, during the second driving period P2, the first scan signal SCAN1(n) is at the turn-on level, the second scan signal SCAN2(n−1) is at the turn-on level, and the emission control signal EM(n) is at the turn-off level.

Accordingly, as shown in FIG. 5A, the first initializing transistor TIN1 is turned on by the second scan signal SCAN2(n−1), the second switching transistor TSW2 is turned on by the first scan signal SCAN1(n), to apply the initializing voltage VREF to the second node N2 and the third node N3. In addition, the first switching transistor TSW1 is turned on by the first scan signal SCAN1(n) and applies the data voltage VDATA supplied from the data line to the first node N1.

Figure 6A:
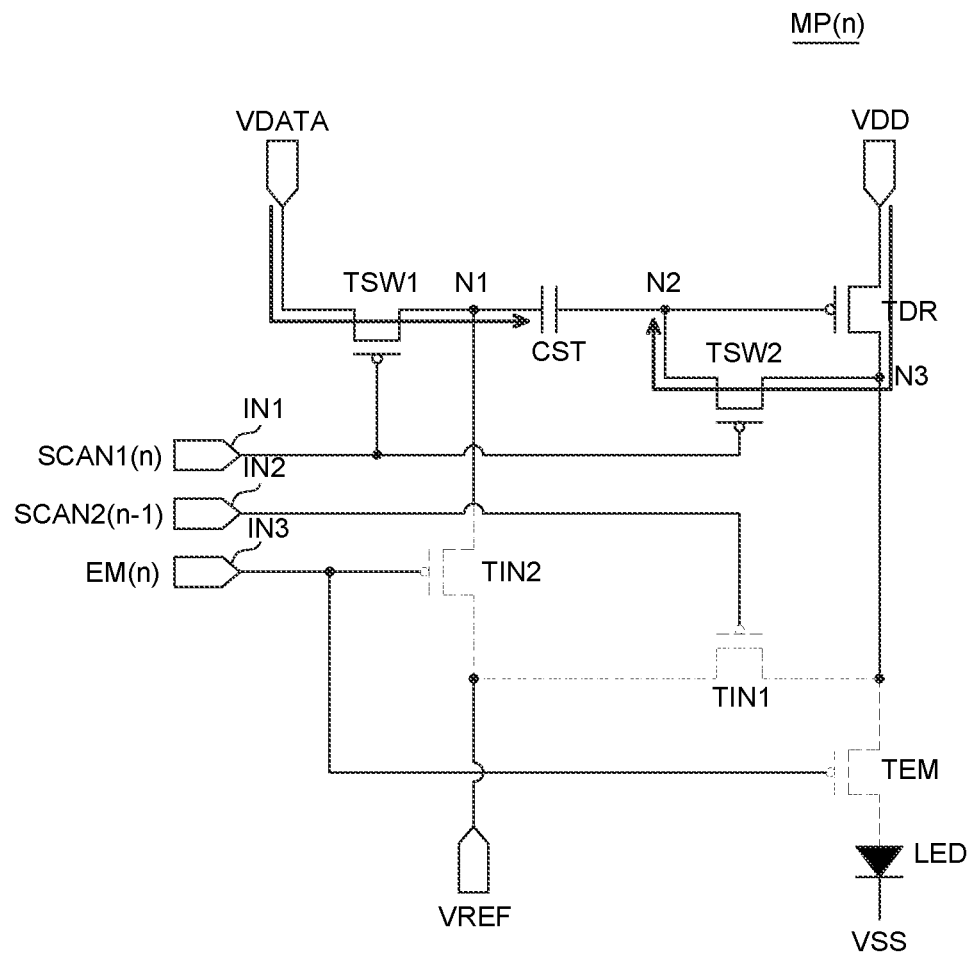
FIG. 6A is a circuit diagram for illustrating a third driving period of the main pixel of the display device according to the exemplary embodiment.

FIG. 6A is a circuit diagram for illustrating a third driving period of the main pixel of the display device according to the exemplary embodiment.

Figure 6B:
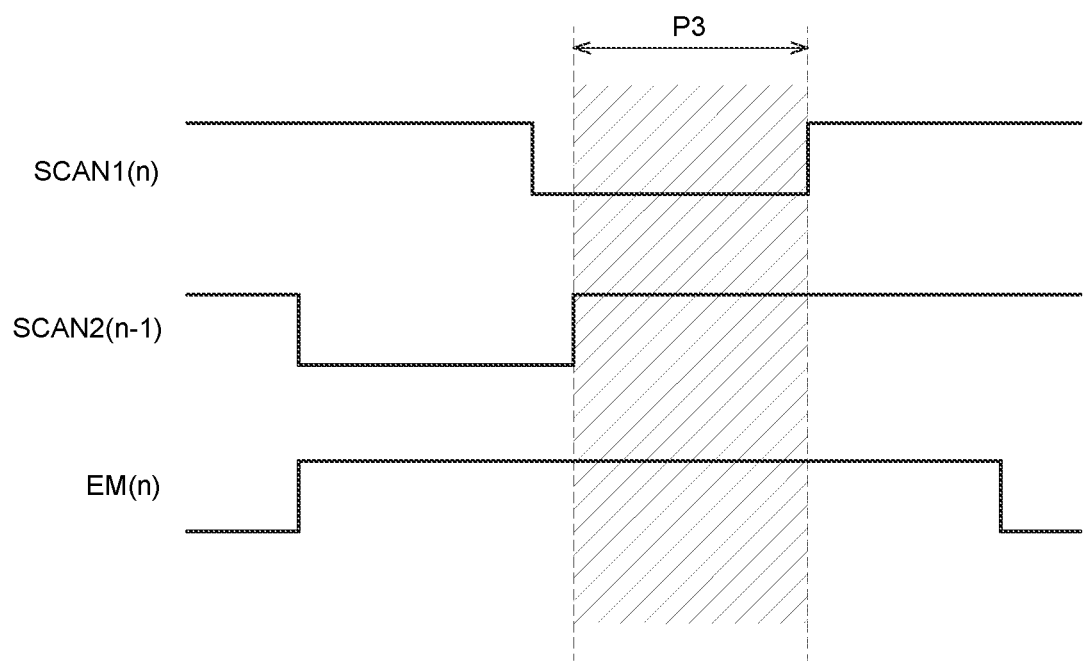
FIG. 6B is a timing diagram for illustrating the third driving period of the main pixel of the display device according to the exemplary embodiment.

FIG. 6B is a timing diagram for illustrating the third driving period of the main pixel of the display device according to the exemplary embodiment.

As shown in FIG. 6B, during the third driving period P3, the first scan signal SCAN1(n) is at the turn-on level, the second scan signal SCAN2(n−1) is at the turn-off level, and the emission control signal EM(n) is at the turn-off level.

Accordingly, as shown in FIG. 6A, the second switching transistor TSW2 is turned on by the first scan signal SCAN1(n), and electrically connects the second node N2 with the third node N3 to diode-connect the gate electrode with the second electrode of the driving transistor TDR. Accordingly, by the second switching transistor TSW2, the voltage of the second node N2 increases along with the voltage of the third node N3. As the voltage of the second node N2 increases, the gate-source voltage difference Vgs of the driving transistor TDR gradually decreases, and the driving transistor TDR is turned off when the gate-source voltage difference of the driving transistor TDR becomes less than the threshold voltage Vth. Accordingly, the voltage of the second node N2 is charged by the difference between the pixel-high voltage VDD and the threshold voltage Vth.

In addition, the first switching transistor TSW1 is turned on by the first scan signal SCAN1(n) and maintains the state of the second driving period P2 in which the data voltage VDATA supplied from the data line is applied to the first node N1.

Accordingly, the voltage (VDD−Vth)−VDATA is charged across the storage capacitor CST during the third driving period P3.

Figure 7A:
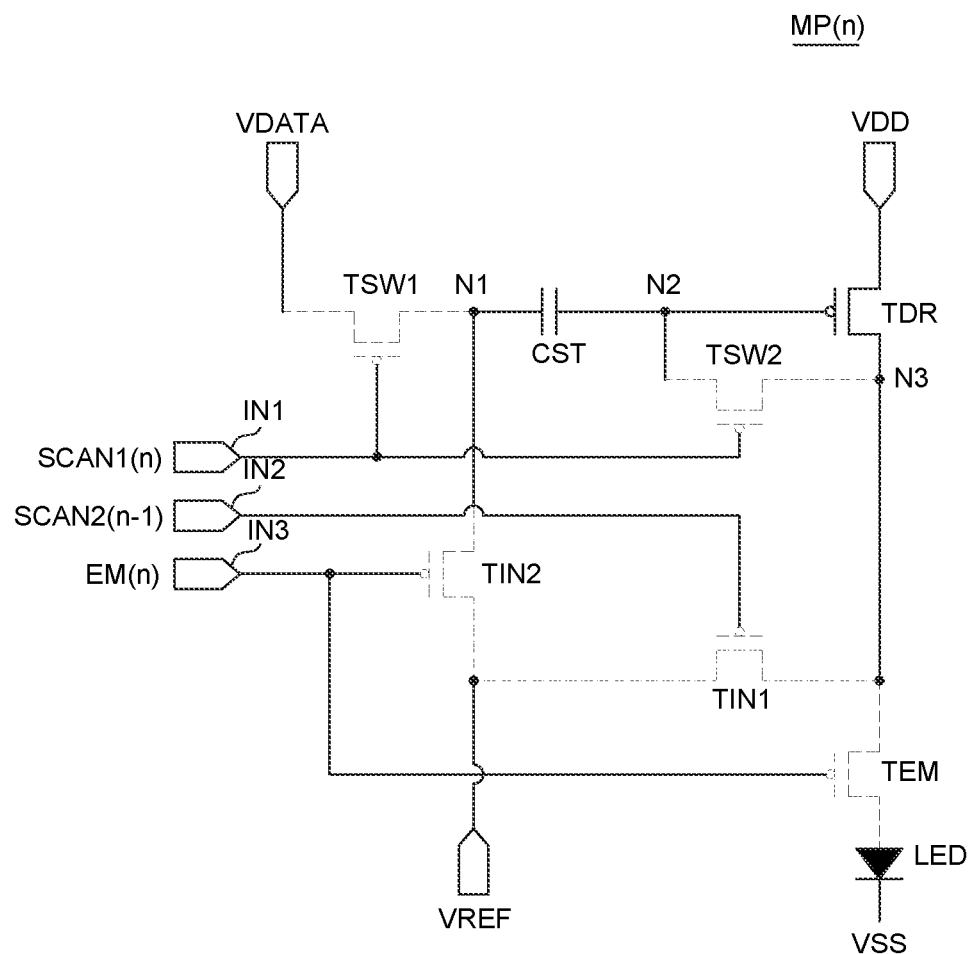
FIG. 7A is a circuit diagram for illustrating a fourth driving period of the main pixel of the display device according to the exemplary embodiment.

FIG. 7A is a circuit diagram for illustrating a fourth driving period of the main pixel of the display device according to the exemplary embodiment.

Figure 7B:
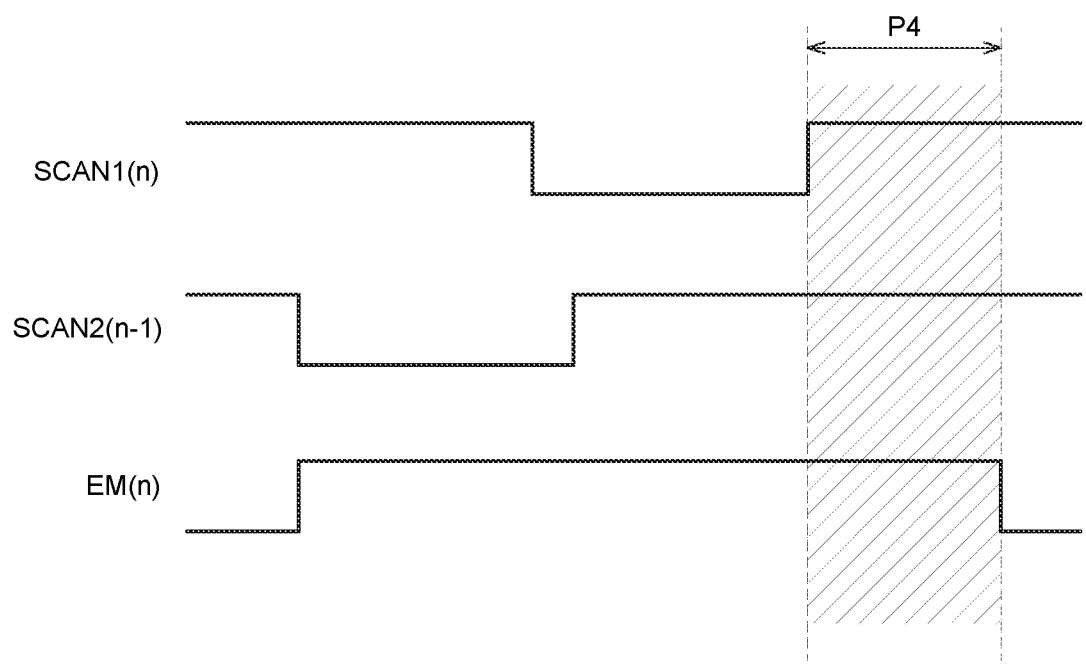
FIG. 7B is a timing diagram for illustrating the fourth driving period of the main pixel of the display device according to the exemplary embodiment.

FIG. 7B is a timing diagram for illustrating the fourth driving period of the main pixel of the display device according to the exemplary embodiment.

As shown in FIG. 7B, during the fourth driving period P4, the first scan signal SCAN1(n), the second scan signal SCAN2(n−1) and the emission control signal EM(n) are all at the turn-off level.

Accordingly, as shown in FIG. 7A, the first switching transistor TSW1, the second switching transistor TSW2, the emission control transistor TEM, the first initializing transistor TIN1 and the second initializing transistor INT2 are all turned off. Accordingly, the voltage (VDD–Vth)–VDATA is held across the storage capacitor CST during the fourth driving period P4.

Figure 8A:
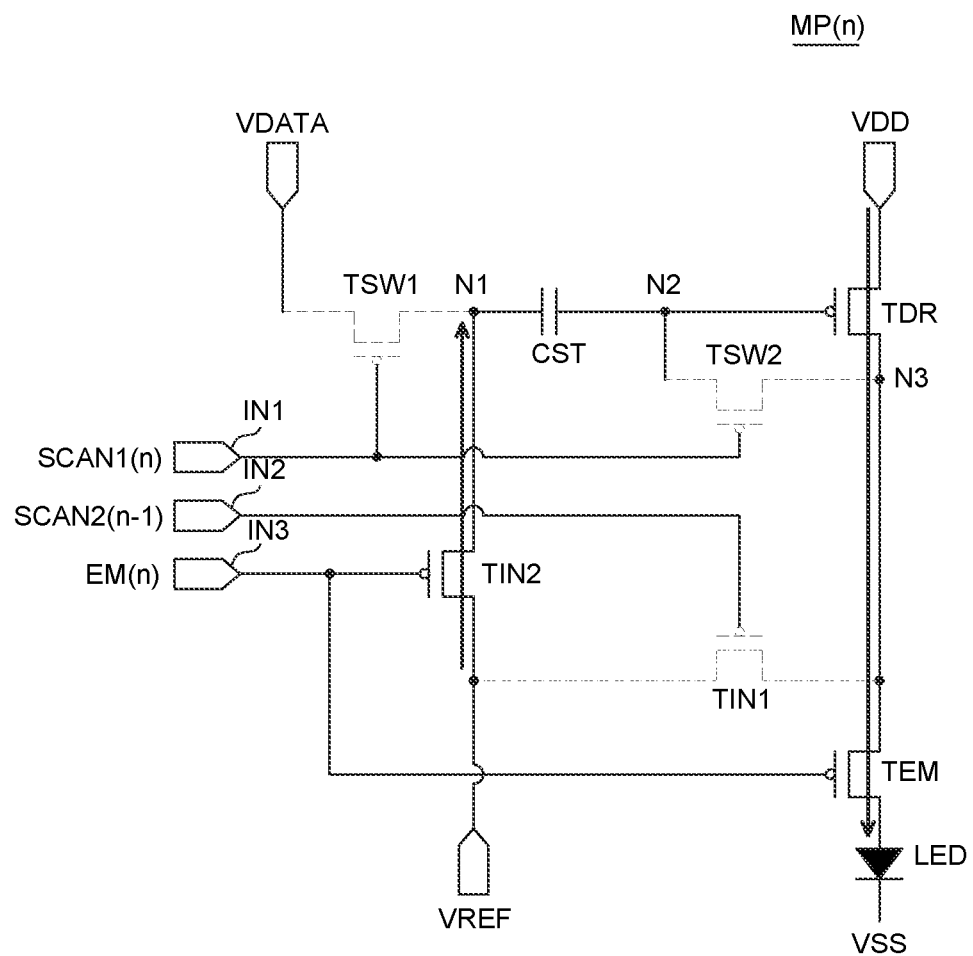
FIG. 8A is a circuit diagram for illustrating a fifth driving period of the main pixel of the display device according to the exemplary embodiment.

FIG. 8A is a circuit diagram for illustrating a fifth driving period of the main pixel of the display device according to the exemplary embodiment.

Figure 8B:
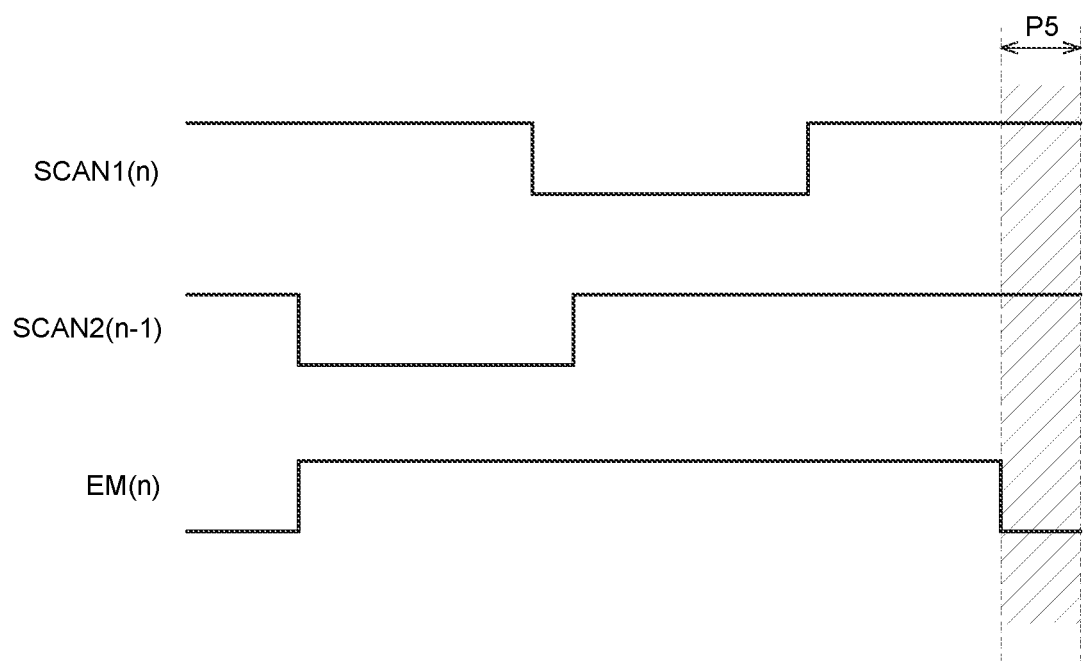
FIG. 8B is a timing diagram for illustrating the fifth driving period of the main pixel of the display device according to the exemplary embodiment.

FIG. 8B is a timing diagram for illustrating the fifth driving period of the main pixel of the display device according to the exemplary embodiment.

As shown in FIG. 8B, during the fifth driving period P5, the first scan signal SCAN1(n) and the second scan signal SCAN2(n–1) are at the turn-off level, and the emission control signal EM(n) is at the turn-on level.

Accordingly, as shown in FIG. 8A, in the fifth driving period P5, the second initializing transistor TIN2 is turned on by the emission control signal EM(n), to apply the initializing voltage VREF. Accordingly, the voltage of the first node N1 is changed from the data voltage VDATA to the initializing voltage VREF, and the voltage of the second node N2 connected to the first node N1 by the storage capacitor CST is changed to the voltage (VDD–Vth)–(VDATA–VREF) by capacitive coupling.

Then, in the fifth driving period P5, the emission control transistor TEM is turned on by the emission control signal EM(n) to form a current path between the third node N3 and the LED to allow the LED to emit light.

Accordingly, the data voltage is reflected in the gate-source voltage difference Vgs of the driving transistor TDR connected to the second node N2, and thus the LED may emit light in proportion to the data voltage.

Hereinafter, a circuit structure of a gate driver of a display device according to an exemplary embodiment of the present disclosure will be described in detail with reference to FIGS. 9 and 10.

Transistors to be described below may be implemented as transistors having an n-type or p-type MOSFET structure. Although p-type transistors will be described in the following description, it is to be understood that the present disclosure is not limited thereto.

Figure 9:
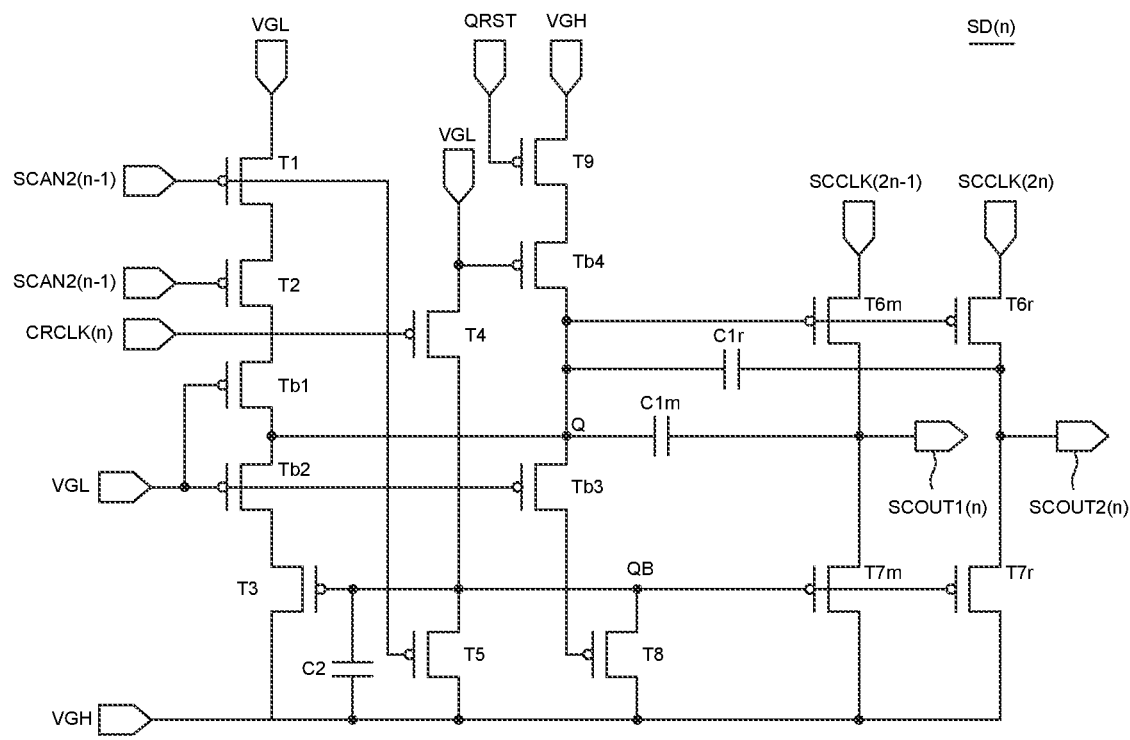
FIG. 9 is a circuit diagram showing a scan driving circuit of a display device according to an exemplary embodiment.

FIG. 9 is a circuit diagram showing a scan driving circuit of a display device according to an exemplary embodiment.

Referring to FIG. 9, the nth scan driving circuit SD(n) of the display device according to the exemplary embodiment includes Q-node controllers T1, T2, Tb1, Tb2, T3, Tb3, Tb4 and T9, QB-node controllers T4, T5 and T8, first scan output units T7m and T7m, second scan output units T6r and T7r, and a plurality of capacitors C1m, C1r and C2.

The Q-node controllers T1, T2, Tb1, Tb2, T3, Tb3, Tb4 and T9 control the voltage of the Q-node Q. In other words, the Q-node controllers T1, T2, Tb1, Tb2, T3, Tb3, Tb4 and T9 determine the charging and discharging timings of the Q-node Q.

The Q-node controllers T1, T2, Tb1, Tb2, T3, Tb3, Tb4 and T9 include a T1 transistor T1, a T2 transistor T2, a Tb1 transistor Tb1, a Tb2 transistor Tb2, a T3 transistor T3, a Tb3 transistor Tb3, a Tb4 transistor Tb4, and a T9 transistor T9.

A gate-low voltage VGL having a turn-on level is applied to the gate electrode of each of the Tb1 transistor Tb1, the Tb2 transistor Tb2, the Tb3 transistor Tb3 and the Tb4 transistor Tb4. Accordingly, the Tb1 transistor Tb1, the Tb2 transistor Tb2, the Tb3 transistor Tb3 and the Tb4 transistor Tb4 are always turned on. Therefore, the transistors excluding the Tb1 transistor Tb1, the Tb2 transistor Tb2, the Tb3 transistor Tb3 and the Tb4 transistor Tb4 will be mainly described in detail.

The T1 transistor T1 discharges the Q-node Q in response to the second scan signal SCAN2(n–1) of the previous stage or the gate start signal VST. Specifically, the second scan signal SCAN2(n–1) of the previous stage or the gate start signal VST is applied to the gate electrode of the T1 transistor T1, the gate-low voltage VGL is applied to the first electrode of the T1 transistor T1, and the second electrode of the T1 transistor T1 is connected to the T2 transistor T2.

The T2 transistor T2 discharges the Q-node Q in response to the second scan signal SCAN2(n–1) of the previous stage or the gate start signal VST. Specifically, the second scan signal SCAN2(n–1) of the previous stage or the gate start signal VST is applied to the gate electrode of the T2 transistor T2, the T1 transistor T1 is connected to the first electrode of the T2 transistor T2, and the second electrode of the T2 transistor T2 is connected to the Tb1 transistor Tb1.

Accordingly, while the second scan signal SCAN2(n–1) or the gate start signal VST of the previous stage is at the turn-on level, the T1 transistor T1, the T2 transistor T2 and the Tb1 transistor Tb1 are all turned on, discharging the Q-node Q to the gate-low voltage VGL having the turn-on level.

The T3 transistor T3 charges the Q-node Q in response to the voltage of the QB-node QB. Specifically, the gate electrode of the T3 transistor T3 is connected to the QB-node QB, the gate-high voltage VGH having the turn-off level is applied to the first electrode of the T3 transistor T3, and the second electrode of the T3 transistor T3 is connected to the Tb2 transistor Tb2. In addition, the first electrode of the Tb2 transistor Tb2 is connected to the T3 transistor T3, and the second electrode thereof is connected to the Q-node Q.

Accordingly, while the QB-node QB is discharged, the T3 transistor T3 and the Tb2 transistor Tb2 are both turned on and charge the Q-node Q up to the gate-high voltage VGH having the turn-off level.

The T9 transistor T9 charges the Q-node Q in response to a reset signal QRST. Specifically, the reset signal QRST is applied to the gate electrode of the T9 transistor T9, the gate-high voltage VGH having the turn-off level is applied to the first electrode of the T9 transistor T9, and the second electrode of the T9 transistor T9 is connected to the Tb4 transistor Tb4. In addition, the first electrode of the Tb4 transistor Tb4 is connected to the T9 transistor T9, and the second electrode thereof is connected to the Q-node Q.

Accordingly, the reset signal QRST falls to the turn-on level at the end point of one frame, and the T9 transistor T9 and the Tb4 transistor Tb4 are both turned on, to charge the Q-node Q up to the gate-high voltage VGH having the turn-off level.

The QB-node controllers T4, T5 and T8 control the voltage of the QB-node QB. In other words, the QB-node controllers T4, T5 and T8 determines the charging and discharging timing of the QB-node QB.

The QB-node controllers T4, T5 and T8 include the T4 transistor T4, the T5 transistor T5, and the T8 transistor T8.

The 14 transistor T4 charges the QB-node QB by the carry clock signal CRCLK(n). Specifically, the carry clock signal CRCLK(n) is applied to the gate electrode of the T4 transistor T4, the gate-low voltage VGL is applied to the first electrode of the T4 transistor T4, and the second electrode of the T4 transistor 14 is connected to the QB-node QB. Accordingly, while the carry clock signal CRCLK(n) is at the turn-on level, the T4 transistor T4 is turned on, and the QB-node QB is discharged to the gate-low voltage VGL.

The T5 transistor T5 charges the QB-node QB in response to the second scan signal SCAN2($n$−1) of the previous stage or the gate start signal VST. Specifically, the second scan signal SCAN2($n$−1) of the previous stage or the gate start signal VST is applied to the gate electrode of the T5 transistor T5, the gate-high voltage VGH is applied to the first electrode of the T5 transistor T5, and the second electrode of the T5 transistor T5 is connected to the QB-node QB.

Accordingly, while the second scan signal SCAN2($n$−1) of the previous stage or the gate start signal VST is at the turn-on level, the T5 transistor T5 is turned on to charge the QB-node QB to the gate-high voltage VGH having the turn-off level.

The T8 transistor T8 charges the QB-node QB in response to the voltage of the Q-node Q. Specifically, the gate electrode of the T8 transistor T8 is connected to the Tb3 transistor Tb3, the gate-high voltage VGH is applied to the first electrode of the T8 transistor T8, and the second electrode of the T8 transistor T8 is connected to the QB-node QB. In addition, the first electrode of the Tb3 transistor Tb3 is connected to the Q-node Q, and the second electrode of the Tb3 transistor Tb3 is connected to the T8 transistor.

Accordingly, while the Q-node Q is discharged, the eighth transistor T8 is turned on to charge the QB-node QB to the gate-high voltage VGH.

The first scan output units T6$m$ and T7$m$ output the first scan signal SCAN1($n$) by the voltage of the Q-node Q and the QB-node QB.

Specifically, the first scan output unit T6$m$ and T7$m$ include a T6$m$ transistor T6$m$ that pulls up the first scan signal SCAN1($n$), and a T7$m$ transistor T7$m$ that pulls down the first scan signal SCAN1($n$).

The gate electrode of the T6$m$ transistor T6$m$ is connected to the Q-node Q, a scan clock signal SCCLK($2n$−1) is applied to the first electrode of the T6$m$ transistor T6$m$, and a second electrode of the T6$m$ transistor T6$m$ is connected to a first scan output unit terminal SCOUT1($n$). Accordingly, when the Q-node Q is discharged, the T6$m$ transistor T6$m$ is turned on to output the scan clock signal SCCLK($2n$−1) as the first scan signal SCAN1($n$).

The gate electrode of the T7$m$ transistor T7$m$ is connected to the QB-node QB, the gate-high voltage VGH is applied to the first electrode of the T7$m$ transistor T7$m$, and the second electrode of the T7$m$ transistor T7$m$ is connected to the first scan output unit terminal SCOUT1($n$). Accordingly, when the QB-node QB is discharged, the T7$m$ transistor T7$m$ is turned on and outputs the gate-high voltage VGH as the first scan signal SCAN1($n$).

The second scan output units T6$r$ and T7$r$ output the second scan signal SCAN2($n$) by the voltage of the Q-node Q and the QB-node QB.

Specifically, the second scan output units T6$r$ and T7$r$ include a T6$r$ transistor T6$r$ that pulls up the second scan signal SCAN2($n$), and a T7$r$ transistor T7$r$ that pulls down the second scan signal SCAN2($n$). The second scan output unit T6$r$ and T7$r$ may be referred to as carry output unit.

The gate electrode of the T6$r$ transistor T6$r$ is connected to the Q-node Q, a scan clock signal SCCLK($2n$) is applied to the first electrode of the T6$r$ transistor T6$r$, and a second electrode of the T6$r$ transistor T6$r$ is connected to a second scan output unit terminal SCOUT2($n$). Accordingly, when the Q-node Q is discharged, the T6$r$ transistor T6$r$ is turned on to output the scan clock signal SCCLK($2n$) as the second scan signal SCAN2($n$).

The gate electrode of the T7$r$ transistor T7$r$ is connected to the QB-node QB, the gate-high voltage VGH is applied to the first electrode of the T7$r$ transistor T7$r$, and the second electrode of the T7$r$ transistor T7$r$ is connected to the second scan output unit terminal SCOUT2($n$). Accordingly, when the QB-node QB is discharged, the T7$r$ transistor T7$r$ is turned on and outputs the gate-high voltage VGH as the second scan signal SCAN2($n$).

A C1$m$ capacitor C1$m$ serves as a bootstrap capacitor that boosts the voltage at the Q-node. Specifically, one end of the C1$m$ capacitor C1$m$ is connected to the gate electrode of the T6$m$ transistor T6$m$, and the other end of the C1$m$ capacitor C1$m$ is connected to the second electrode of the T6$m$ transistor T6$m$, which is the first scan output unit terminal SCOUT1($n$). Accordingly, if the first scan signal SCAN1($n$) output from the first scan output unit terminal SCOUT1($n$), which is the second electrode of the T6$m$ transistor T6$m$, falls to the turn-on level while the Q-node Q is discharged, the voltage at the Q-node Q may be boosted by the C1$m$ capacitor C1$m$.

A C1$r$ capacitor C1$r$ serves as a bootstrap capacitor that boosts the voltage at the Q-node. Specifically, one end of the C1$r$ capacitor C1$r$ is connected to the gate electrode of the T6$r$ transistor T6$r$, and the other end of the C1$r$ capacitor C1$r$ is connected to the second electrode of the T6$r$ transistor T6$r$, which is the second scan output unit terminal SCOUT2($n$). Accordingly, if the second scan signal SCAN2($n$) output from the second scan output unit terminal SCOUT2($n$), which is the second electrode of the T6$r$ transistor T6$r$, falls to the turn-on level while the Q-node Q is discharged, the voltage at the Q-node Q may be boosted by the C1$r$ capacitor C1$r$.

The second capacitor C2 stabilizes the QB-node QB. The gate-high voltage VGH is constantly applied to one end of the second capacitor C2, and the other end of the second capacitor C2 is connected to the QB-node QB. Accordingly, the potential of one end of the second capacitor C2 does not change, and thus the voltage of the QB-node QB is stabilized, so that the first scan signal SCAN1($n$), the second scan signal SCAN2($n$), and the carry signal CARRY($n$) can be output without delay.

Figure 10:
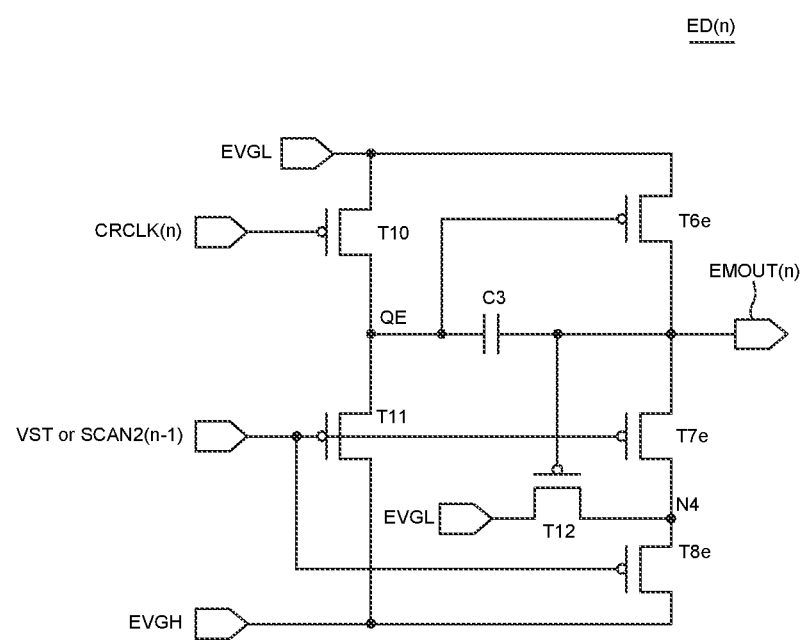
FIG. 10 is a circuit diagram for illustrating an emission driving circuit of a display device according to an exemplary embodiment.

FIG. 10 is a circuit diagram for illustrating an emission driving circuit of a display device according to an exemplary embodiment.

Referring to FIG. 10, the nth emission driving circuit ED(n) of the display device according to the exemplary embodiment includes QE-node controllers T10 and T11, emission outputs T6$e$, T7$e$ and T8$e$, a T12 transistor T12 and a third capacitor C3.

The QE-node controllers T10 and T11 control the voltage of the QE-node QE. In other words, the QE-node controllers T10 and T11 determine charging and discharging timings of the QE-node QE.

The QE-node controllers T10 and T11 include a T10 transistor T10 and a T11 transistor T11.

The T10 transistor T10 discharges the QE-node QE in response to the carry clock signal CRCLK(n). Specifically, the carry clock signal CRCLK(n) is applied to the gate electrode of the T10 transistor T10, an emission-low voltage EVGL is applied to the first electrode of the T10 transistor T10, and the second electrode of the T10 transistor T10 is connected to the QE-node QE.

Accordingly, while the carry clock signal CRCLK(n) is at the turn-on level, the T10 transistor T10 is turned on, such that the QE-node QE is discharged to the emission-low voltage EVGL having the turn-on level.

The T11 transistor T11 charges the QE-node QE in response to the second scan signal SCAN2(n−1) of the previous stage or the gate start signal VST. Specifically, the second scan signal SCAN2(n−1) of the previous stage or the gate start signal VST is applied to the gate electrode of the T11 transistor T11, the emission-high voltage EVGH having the turn-off level is applied to the first electrode of the T11 transistor T11, and the second electrode of the T11 transistor T11 is connected to the QE-node QE.

Accordingly, while the second scan signal SCAN2(n−1) or the gate start signal VST of the previous stage is at the turn-on level, the T11 transistor T11 is turned on to charge the QE-node QE to the emission-high voltage EVGH having the turn-off level.

The emission outputs T6e, T7e, and T8e output the emission control signal EM(n) by the voltage of the QE-node QE.

Specifically, the emission outputs T6e, T7e and T8e include a T6e transistor T6e that pulls up the emission control signal EM(n), and a T7e transistor T7e and a T8e transistor T8e that pull down the emission control signal EM(n).

The gate electrode of the T6e transistor T6e is connected to the QE-node QE, the emission-low voltage EVGL is applied to the first electrode of the T6e transistor T6e, and the second electrode of the T6e transistor T6e is connected to the emission output unit terminal EMOUT(n). Accordingly, when the QE-node QE is discharged, the T6e transistor T6e is turned on to output the emission-low voltage EVGL as the emission control signal EM(n).

The second scan signal SCAN2(n−1) or the gate start signal VST of the previous stage is applied to the gate electrode of the T7e transistor T7e, a fourth node N4 is connected to the first electrode of the T7e transistor T7e, and a second electrode of the T7e transistor T7e is connected to the emission output unit terminal EMOUT(n).

The second scan signal SCAN2(n−1) or the gate start signal VST of the previous stage is applied to the gate electrode of the T8e transistor T8e, the emission-high voltage EVGH having the turn-off level is applied to the first electrode of the T8e transistor T8e, and a second electrode of the T8e transistor T8e is connected to the fourth node N4.

Accordingly, while second scan signal SCAN2(n−1) or the gate start signal VST of the previous stage is at the turn-on level, the T7e transistor T7e and T8e transistor T8e are turned on, to output the emission-high voltage EVGH as the emission control signal EM(n).

In addition, the third capacitor C3 serves as a bootstrap capacitor that boosts the voltage at the QE-node. Specifically, one end of the third capacitor C3 is connected to the gate electrode of the T6e transistor T6e, and the other end of the third capacitor C3 is connected to the second electrode of the T6e transistor T6e, which is the emission output unit terminal EMOUT(n). Accordingly, if the emission control signal EM(n) output from the emission output unit terminal EMOUT(n), which is the second electrode of the T6e transistor T6e, falls to the turn-on level while the QE-node QE is discharged, the voltage at the QE-node QE may be boosted by the third capacitor C3.

The T12 transistor T12 charges the fourth node N4 in response to the voltage of the emission output unit terminal EMOUT(n). Specifically, the gate electrode of the T12 transistor T12 is connected to the emission output unit terminal EMOUT(n), the emission-low voltage EVGL is applied to the first electrode of the T12 transistor T12, and a second electrode of the T12 transistor T12 is connected to the fourth node N4. Accordingly, while the emission control signal EM(n) output from the emission output unit terminal EMOUT(n) is at the turn-off level, the T12 transistor T12 is turned off, the emission-low voltage EVGL having the turn-on level is not charged at the fourth node N4.

Hereinafter, a driving scheme of the gate driver GD of the display device 100 according to the exemplary embodiment of the present disclosure will be described in detail with reference to FIGS. 11 to 20.

Figure 11:
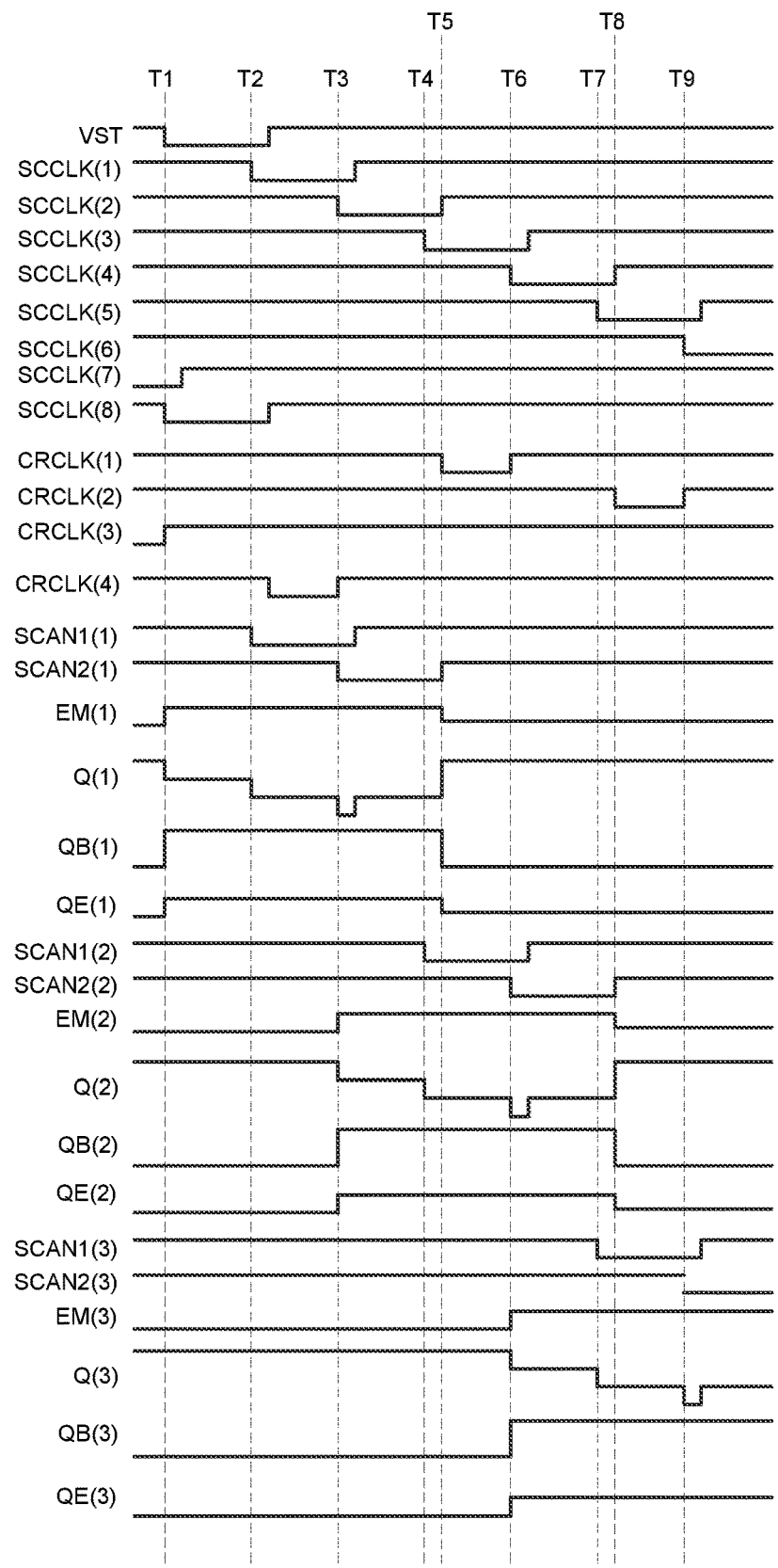
FIG. 11 is a timing diagram showing input signals/output signals of the gate driver of the display device according to the exemplary embodiment of the present disclosure.

FIG. 11 is a timing diagram showing input signals/output signals of the gate driver of the display device according to the exemplary embodiment of the present disclosure.

FIGS. 12 to 20 are circuit diagrams for illustrating a driving scheme of a gate driver of a display device according to an exemplary embodiment of the present disclosure.

Figure 12:
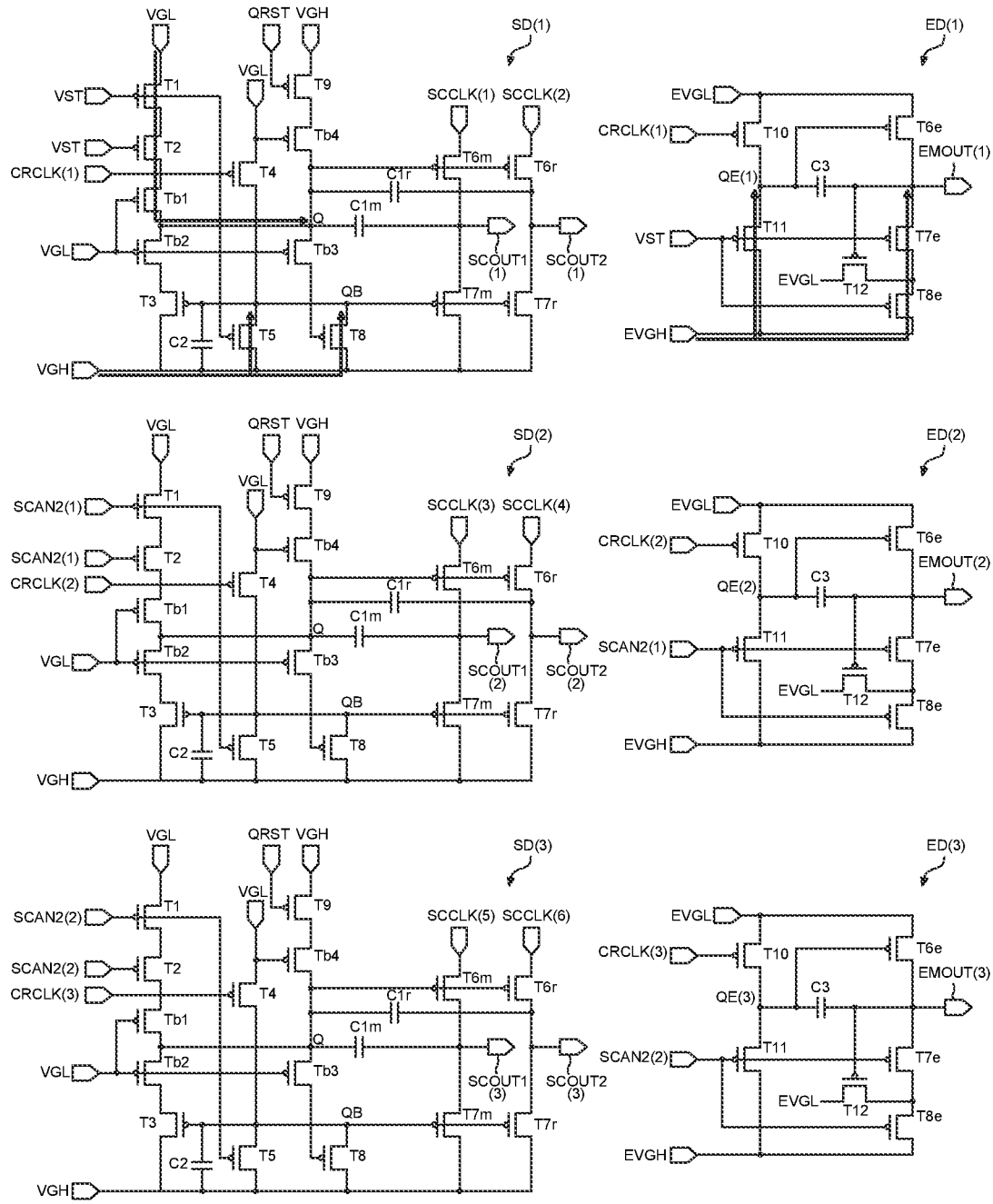
FIGS. 12 to 20 are circuit diagrams for illustrating a driving scheme of a gate driver of a display device according to an exemplary embodiment of the present disclosure.
Figure 13:
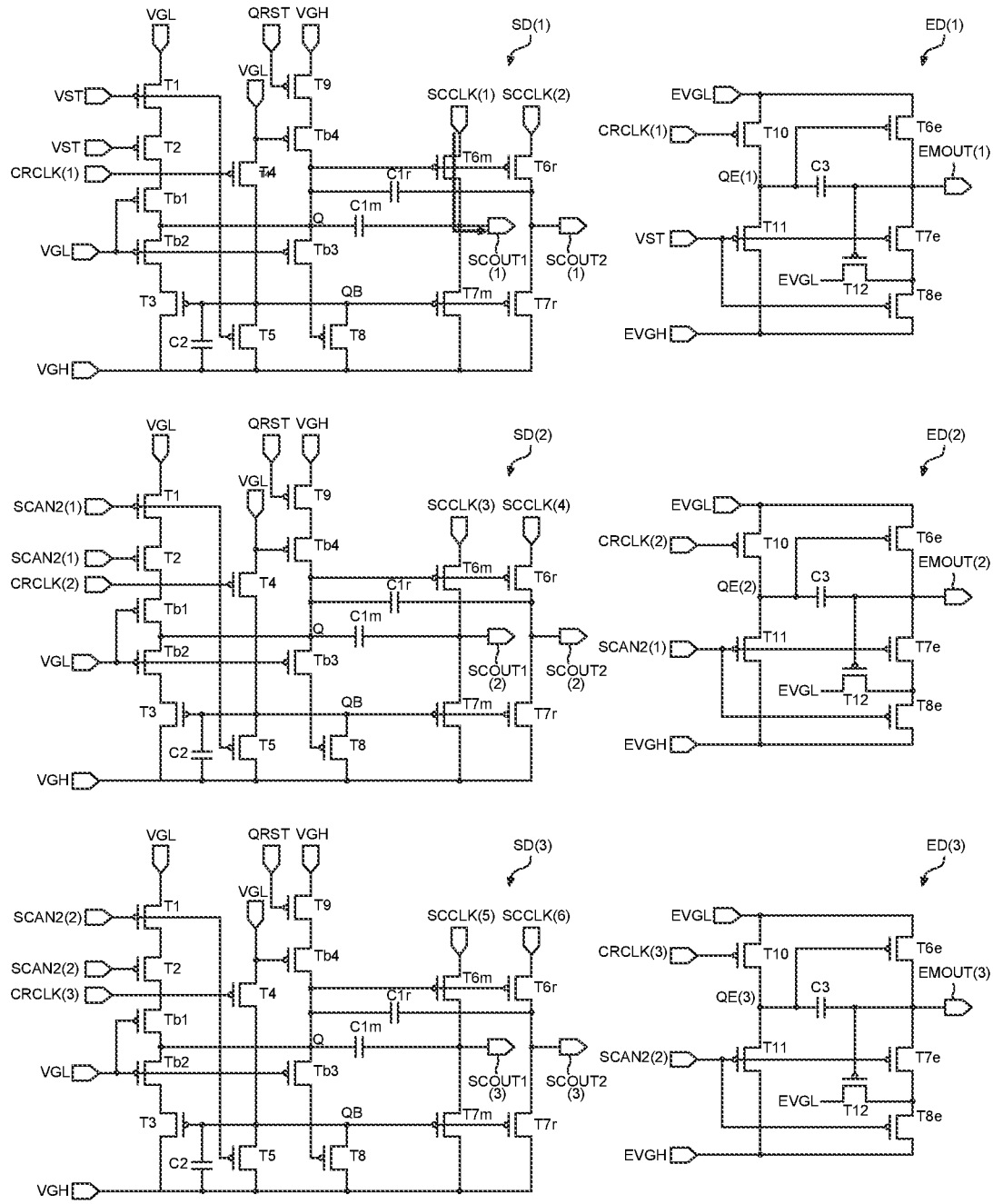
Figure 14:
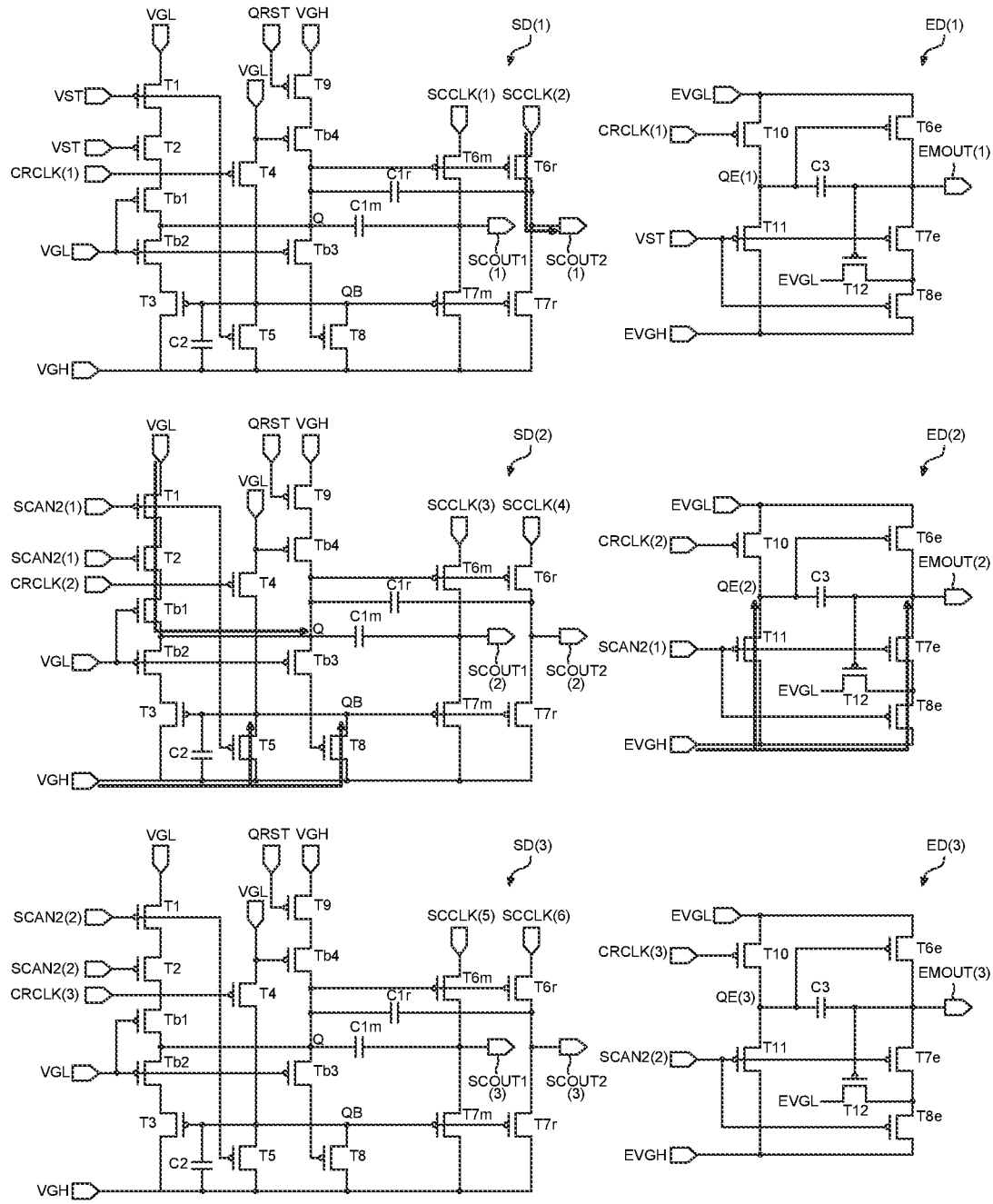
Figure 15:
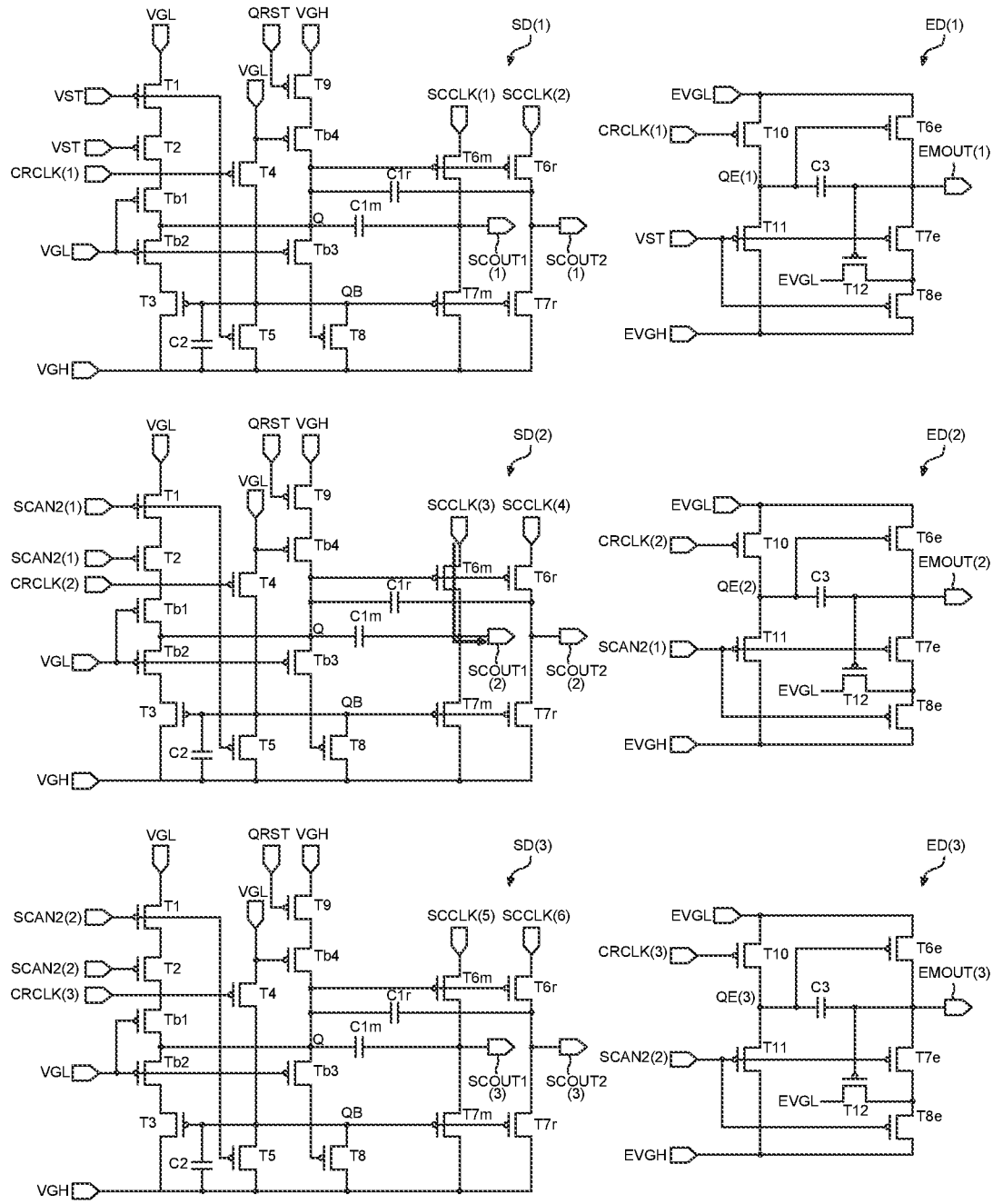
Figure 16:
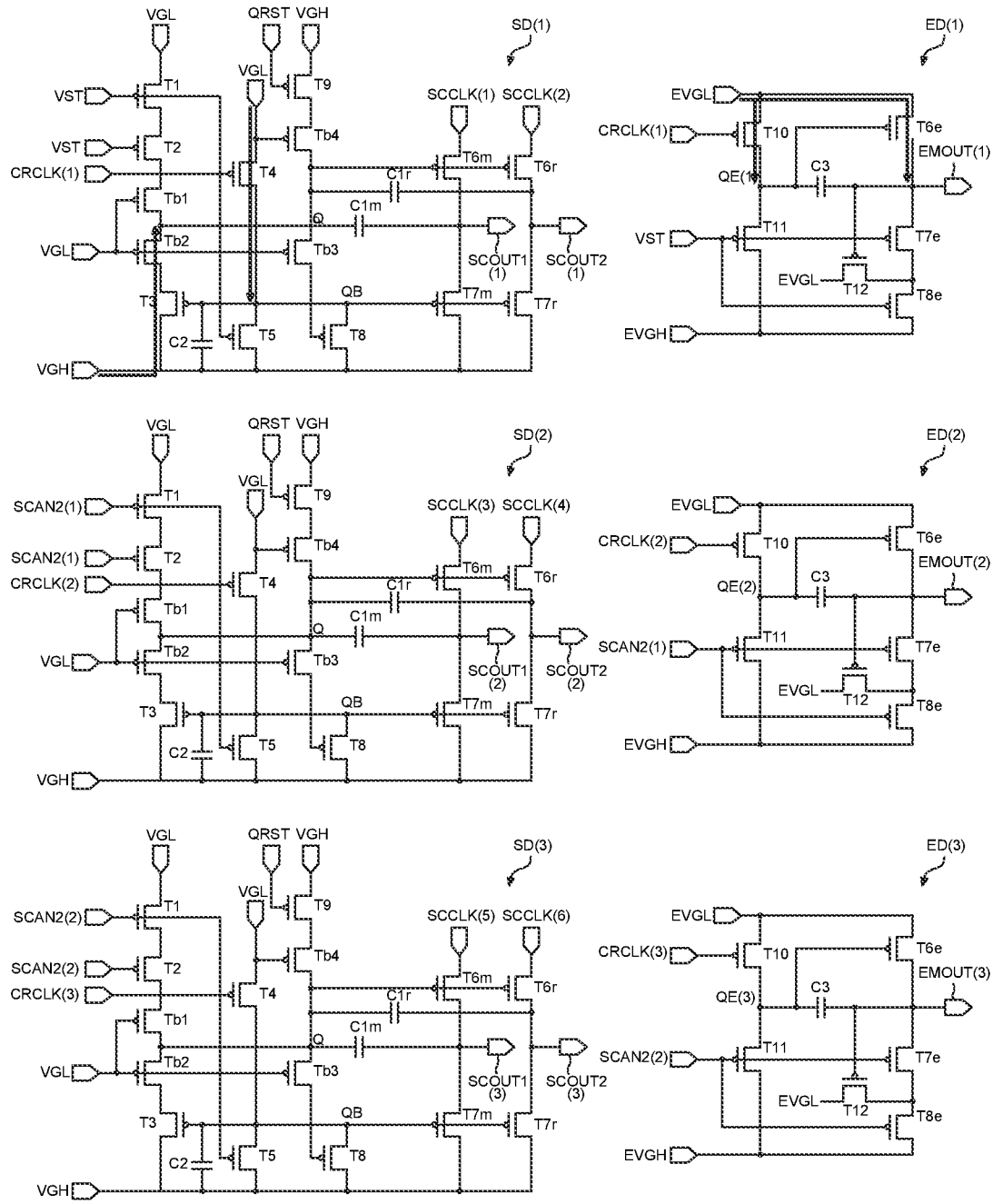
Figure 17:
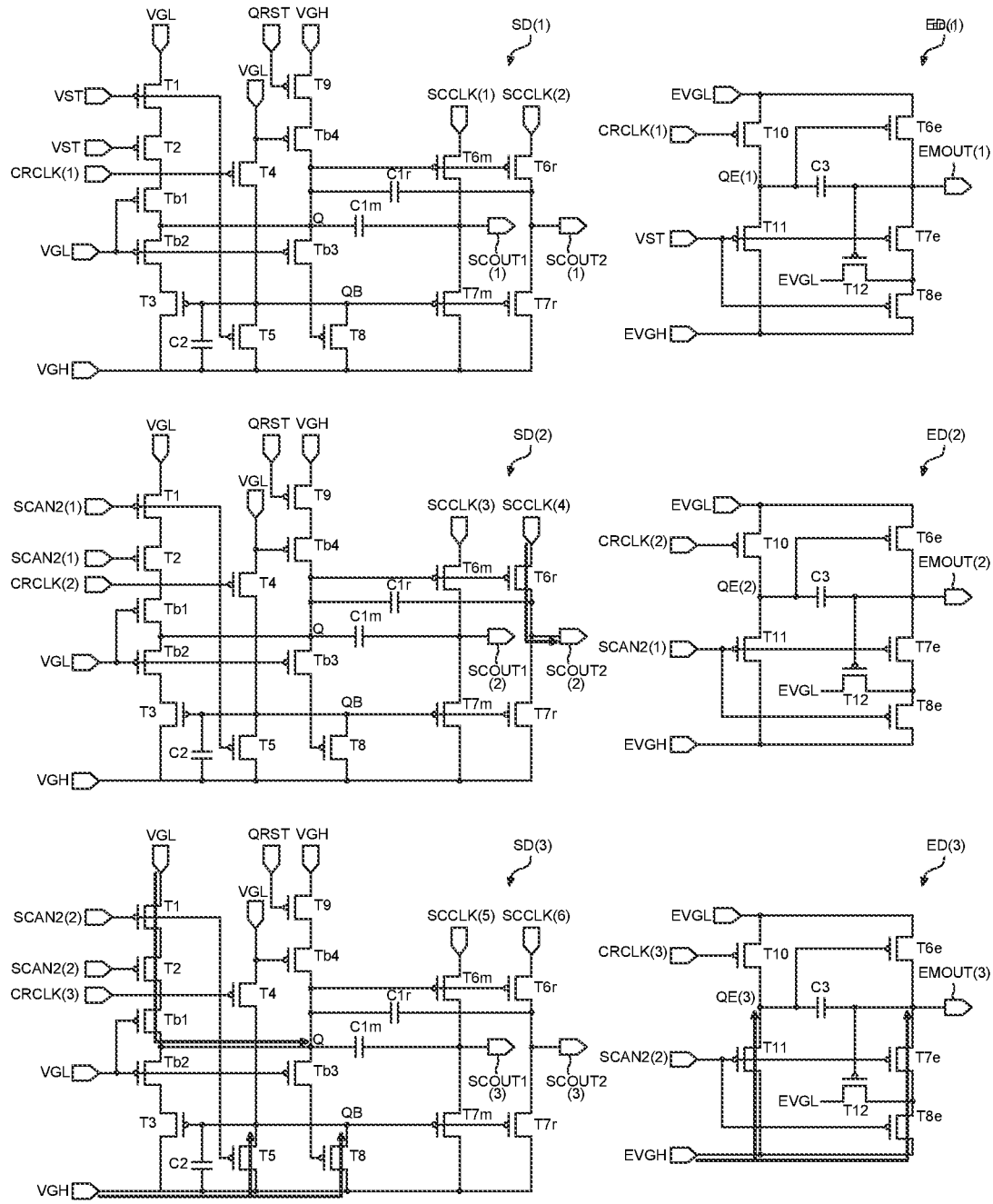
Figure 18:
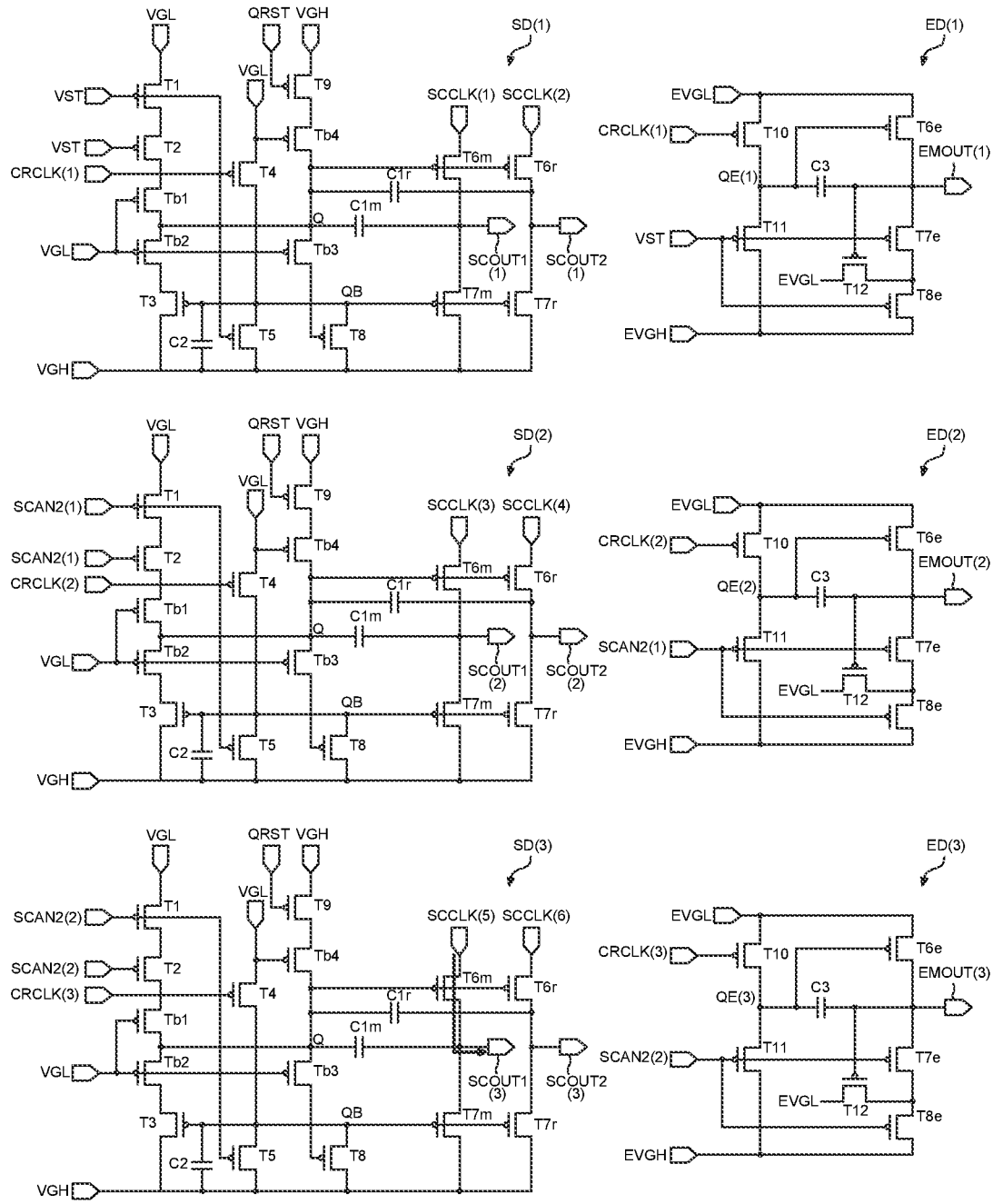
Figure 19:
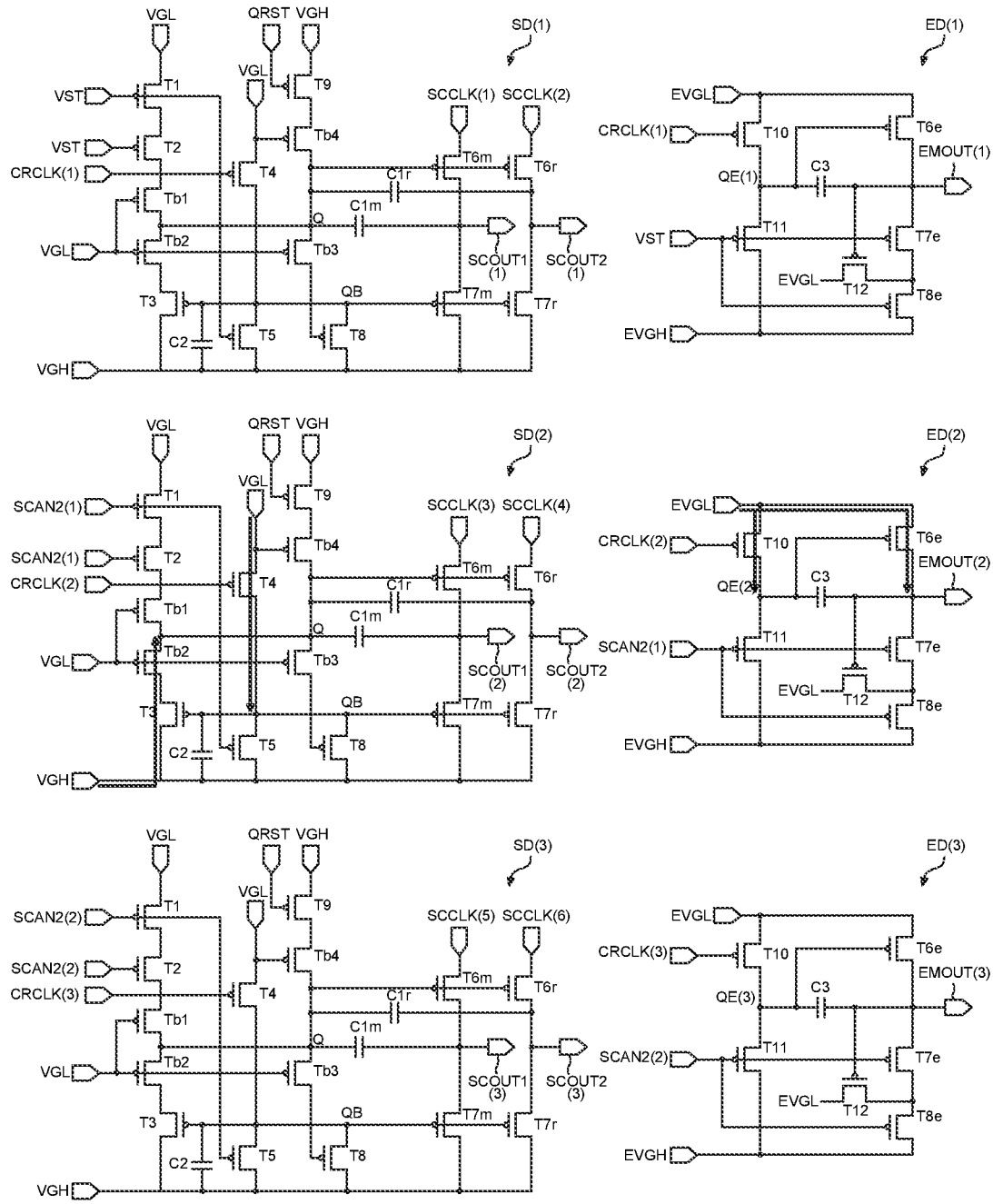
Figure 20:
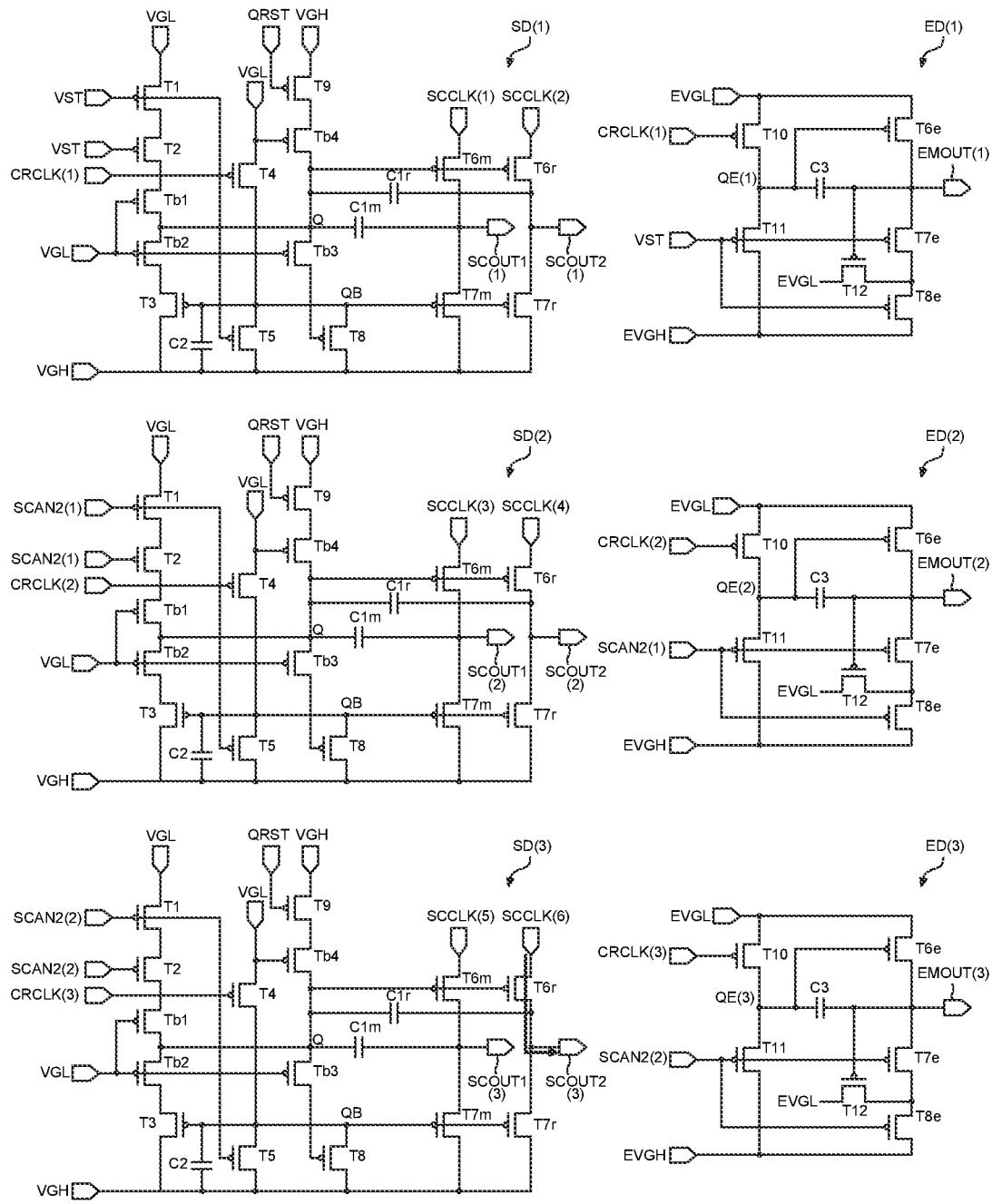

Specifically, FIG. 12 is a circuit diagram for illustrating the driving scheme of the gate driver of the display device according to the exemplary embodiment of the present disclosure at a first time point of FIG. 11. FIG. 13 is a circuit diagram for illustrating the driving scheme of the gate driver of the display device according to the exemplary embodiment of the present disclosure at a second time point of FIG. 11. FIG. 14 is a circuit diagram for illustrating the driving scheme of the gate driver of the display device according to the exemplary embodiment of the present disclosure at a third time point of FIG. 11. FIG. 15 is a circuit diagram for illustrating the driving scheme of the gate driver of the display device according to the exemplary embodiment of the present disclosure at a fourth time point of FIG. 11. FIG. 16 is a circuit diagram for illustrating the driving scheme of the gate driver of the display device according to the exemplary embodiment of the present disclosure at a fifth time point of FIG. 11. FIG. 17 is a circuit diagram for illustrating the driving scheme of the gate driver of the display device according to the exemplary embodiment of the present disclosure at a sixth time point of FIG. 11. FIG. 18 is a circuit diagram for illustrating the driving scheme of the gate driver of the display device according to the exemplary embodiment of the present disclosure at a seventh time point of FIG. 11. FIG. 19 is a circuit diagram for illustrating the driving scheme of the gate driver of the display device according to the exemplary embodiment of the present disclosure at an eighth time point of FIG. 11. FIG. 20 is a circuit diagram for illustrating the driving scheme of the gate driver of the display device according to the exemplary embodiment of the present disclosure at a ninth time point of FIG. 11.

Referring to FIGS. 11 and 12, at a first time point T1, the gate start signal VST falls to a low level that is the turn-on level.

Accordingly, in the first scan driving circuit SD(1), the T1 transistor T1, the T2 transistor T2 and the Tb1 transistor Tb1 are all turned on, so that the Q-node Q(1) is discharged to the gate-low voltage VGL having the turn-on level, and the T5 transistor T5 is turned on to charge the QB-node QB(1) to the gate-high voltage VGH having the turn-off level.

Since the Q-node Q(1) is discharged to the gate-low voltage VGL in the first scan driving circuit SD(1), the T8 transistor T8 is turned on, so that the QB-node QB(1) is charged up to the gate-high voltage VGH.

In addition, in the first emission driving circuit ED(1), the T11 transistor T11 is turned on, and the QE-node QE(1) is charged to the emission-high voltage EVGH having the turn-off level. The T7e transistor T7e and T8e transistor T8e are turned on, and the emission output unit terminal EMOUT(1) is charged with the emission-high voltage EVGH, so that the emission-high voltage EVGH is output as the emission control signal EM(1).

Referring to FIGS. 11 and 13, at a second time point T2, the first scan clock signal SCCLK(1) falls to the low level that is the turn-on level.

Accordingly, in the first scan driving circuit SD(1), the Q-node Q(1) is discharged to the gate-low voltage VGL having the turn-on level, and thus the T6m transistor T6m is turned on. In addition, the T6m transistor T6m outputs the first scan clock signal SCCLK(1) at the low level to the first scan output unit terminal SCOUT1(1), and outputs it as the first scan signal SCAN1(1).

Referring to FIGS. 11 and 14, at a third time point T3, the second scan clock signal SCCLK(2) falls to the low level that is the turn-on level.

Accordingly, in the first scan driving circuit SD(1), the Q-node Q(1) is discharged to the gate-low voltage VGL having the turn-on level, and thus the T6r transistor T6r is turned on. Accordingly, the T6r transistor T6r outputs the second scan clock signal SCCLK(2) at the low level to the second scan output unit terminal SCOUT2(1), and outputs it as the second scan signal SCAN2(1).

Accordingly, in the second scan driving circuit SD(2), the T1 transistor T1 and the T2 transistor T2 are all turned on by the second scan signal SCAN2(1) of the first scan driving circuit SD(1) that is the turn-on level, so that the Q-node Q(2) is discharged to the gate-low voltage VGL having the turn-on level, and the T5 transistor T5 is turned on to charge the QB-node QB(2) to the gate-high voltage VGH having the turn-off level.

Since the Q-node Q(2) is discharged to the gate-low voltage VGL in the second scan driving circuit SD(2), the T8 transistor T8 is turned on, so that the QB-node QB(2) is charged up to the gate-high voltage VGH.

In addition, in the second emission driving circuit ED(2), the T11 transistor T11 is turned on by the second scan signal SCAN2(1) of the first scan driving circuit SD(1) so that the QE-node QE(2) is charged to the emission-high voltage EVGH having the turn-off level. The T7e transistor T7e and T8e transistor T8e are turned on by the second scan signal SCAN2(1) of the first scan driving circuit SD(1) so that the emission output unit terminal EMOUT(2) is charged with the emission-high voltage EVGH, and thus the emission-high voltage EVGH is output as the emission control signal EM(2).

Referring to FIGS. 11 and 15, at a fourth time point T4, the third scan clock signal SCCLK(3) falls to the low level that is the turn-on level.

Accordingly, in the second scan driving circuit SD(2), the Q-node Q(2) is discharged to the gate-low voltage VGL having the turn-on level, and thus the T6m transistor T6m is turned on. In addition, the T6m transistor T6m outputs the third scan clock signal SCCLK(3) at the low level to the first scan output unit terminal SCOUT1(2), and outputs it as the first scan signal SCAN1(2).

Referring to FIGS. 11 and 16, at a fifth time point T5, the first carry clock signal CRCLK(1) falls to the low level that is the turn-on level.

Accordingly, in the first scan driving circuit SD(1), the T4 transistor 14 is turned on by the first carry clock signal CRCLK(1), to discharge the QB-node QB(1) to the gate-low voltage VGL having the turn-on level. Since the QB-node QB(1) is discharged to the gate-low voltage VGL in the first scan driving circuit SD(1), the T3 transistor T3 is turned on, so that the Q-node Q(1) is charged up to the gate-high voltage VGH.

In addition, in the first emission driving circuit ED(1), the T10 transistor T10 is turned on by the first carry clock signal CRCLK(1), so that the QE-node QE(1) is discharged to the emission-low voltage EVGL having the turn-on level. The T6e transistor T6e is also turned on by the first carry clock signal CRCLK(1), so that the emission output unit terminal EMOUT(1) is discharged to the emission-low voltage EVGL, and thus the emission-low voltage EVGL is output as the emission control signal EM(1).

Referring to FIGS. 11 and 17, at a sixth time point T6, the fourth scan clock signal SCCLK(4) falls to the low level that is the turn-on level.

Accordingly, in the second scan driving circuit SD(2), the Q-node Q(2) is discharged to the gate-low voltage VGL having the turn-on level, and thus the T6r transistor T6r is turned on. Accordingly, the T6r transistor T6r outputs the fourth scan clock signal SCCLK(4) at the low level to the second scan output unit terminal SCOUT2(2), and outputs it as the second scan signal SCAN2(2).

Accordingly, in the third scan driving circuit SD(3), the T1 transistor T1 and the T2 transistor T2 are all turned on by the second scan signal SCAN2(2) of the second scan driving circuit SD(2) that is the turn-on level, so that the Q-node Q(3) is discharged to the gate-low voltage VGL having the turn-on level, and the T5 transistor T5 is turned on to charge the QB-node QB(3) to the gate-high voltage VGH having the turn-off level.

Since the Q-node Q(3) is discharged to the gate-low voltage VGL in the third scan driving circuit SD(3), the T8 transistor T8 is turned on, so that the QB-node QB(3) is charged up to the gate-high voltage VGH.

In addition, in the third emission driving circuit ED(3), the T11 transistor T11 is turned on by the second scan signal SCAN2(2) of the second scan driving circuit SD(2) so that the QE-node QE(3) is charged to the emission-high voltage EVGH having the turn-off level. The T7e transistor T7e and T8e transistor T8e are turned on by the second scan signal SCAN2(2) of the second scan driving circuit SD(2) so that the emission output unit terminal EMOUT(3) is charged with the emission-high voltage EVGH, and thus the emission-high voltage EVGH is output as the emission control signal EM(3).

Referring to FIGS. 11 and 18, at a seventh time point T7, the fifth scan clock signal SCCLK(5) falls to the low level that is the turn-on level.

Accordingly, in the third scan driving circuit SD(3), the Q-node Q(3) is discharged to the gate-low voltage VGL having the turn-on level, and thus the T6m transistor T6m is turned on. In addition, the T6m transistor T6m outputs the fifth scan clock signal SCCLK(5) at the low level to the first scan output unit terminal SCOUT1(3), and outputs it as the first scan signal SCAN1(3).

Referring to FIGS. 11 and 19, at an eighth time point T8, the second carry clock signal CRCLK(2) falls to the low level that is the turn-on level.

Accordingly, in the second scan driving circuit SD(2), the 14 transistor T4 is turned on by the second carry clock signal CRCLK(2), to discharge the QB-node QB(2) to the gate-low voltage VGL having the turn-on level. Since the QB-node QB(2) is discharged to the gate-low voltage VGL in the second scan driving circuit SD(2), the T3 transistor T3 is turned on, so that the Q-node Q(2) is charged up to the gate-high voltage VGH.

In addition, in the second emission driving circuit ED(2), the T10 transistor T10 is turned on by the second carry clock signal CRCLK(2), so that the QE-node QE(2) is discharged to the emission-low voltage EVGL having the turn-on level. The T6e transistor T6e is also turned on by the second carry clock signal CRCLK(2), so that the emission output unit terminal EMOUT(2) is discharged to the emission-low voltage EVGL, and thus the emission-low voltage EVGL is output as the emission control signal EM(2).

Referring to FIGS. 11 and 20, at a ninth time point T9, the sixth scan clock signal SCCLK(6) falls to the low level that is the turn-on level.

Accordingly, in the third scan driving circuit SD(3), the Q-node Q(3) is discharged to the gate-low voltage VGL having the turn-on level, and thus the T6r transistor T6r is turned on. Accordingly, the T6r transistor T6r outputs the sixth scan clock signal SCCLK(6) at the low level to the second scan output unit terminal SCOUT2(3), and outputs it as the second scan signal SCAN2(3).

The exemplary embodiments of the present disclosure can also be described as follows:

According to an aspect of the present disclosure, there is provided a display device including a plurality of unit pixels comprising a main pixel and a redundancy pixel which are emitting a same color; and a gate driver integrated in each of the plurality of unit pixels and comprising a plurality of stage, wherein each of the plurality of stage comprises a scan driving circuit for outputting the first scan signal and the second scan signal; and an emission driving circuit for outputting an emission control signal, wherein an output timing of the first scan signal supplied to the main pixel is same as an output timing of the first scan signal supplied to the redundancy pixel, and wherein an output timing of the second scan signal supplied to the main pixel is different from an output timing of the second scan signal supplied to the redundancy pixel.

the scan driving circuit of nth stage among the plurality of stages may comprise a Q-node controller for controlling a voltage of the Q-node, a QB-node controller for controlling a voltage of a QB-node, a first scan output unit for outputting the first scan signal according to the voltage of the Q-node and the voltage of the QB-node and a second scan output unit for outputting the second scan signal according to the voltage of the Q-node and the voltage of the QB-node.

The Q-node controller may comprise a T1 transistor, a T2 transistor and a T3 transistor. In the T1 transistor, a second scan signal of an (n−1)th stage or a gate start signal may be applied to a gate electrode, a gate-low voltage may be applied to a first electrode, and a second electrode may be connected to the T2 transistor. In the T2 transistor, the second scan signal of the (n−1)th stage or the gate start signal may be applied to a gate electrode, a first electrode may be connected to T1 transistor, and a second electrode may be connected to the Q-node. In the T3 transistor, a gate electrode may be connected to the QB-node, a gate-high voltage may be applied to the first electrode, and a second electrode may be connected to the Q-node.

The QB-node controller may comprise a T4 transistor, a T5 transistor and a T8 transistor. In the T4 transistor, a carry clock signal may be applied to a gate electrode, a gate-low voltage may be applied to a first electrode, and a second electrode may be connected to the QB-node. In the T5 transistor, a second scan signal of the (n−1)th stage or a gate start signal may be applied to a gate electrode, a gate-high voltage may be applied to a first electrode, and a second electrode may be connected to the QB-node. In the T8 transistor, a gate electrode may be connected to the Q-node, the gate-high voltage may be applied to the first electrode, and a second electrode may be connected to the QB-node.

The emission driving circuit of nth stage among the plurality of stages may comprise a QE-node controller for controlling a voltage of a QE-node; and an emission output unit for outputting the emission control signal by the voltage of the QE-node.

The QB-node controller may comprise a T10 transistor and a T11 transistor. In the T10 transistor, a carry clock signal may be applied to a gate electrode, an emission-low voltage may be applied to a first electrode, and a second electrode may be connected to the QE node. In the T11 transistor, a second scan signal of an (n−1)th stage or a gate start signal may be applied to a gate electrode, an emission-high voltage may be applied to a first electrode, and a second electrode may be connected to the QE-node.

The scan driving circuit of nth stage among the plurality of stages may apply the second scan signal to the scan driving circuit and the emission driving circuit of the (n+1)th stage.

Each of the main pixel and the redundancy nay comprise a first input terminal, a second input terminal and a third input terminal. The scan driving circuit of the nth stage may apply the first scan signal to a first input terminal of an nth main pixel and a second input terminal of an nth redundancy pixel, and may apply the second scan signal to a first input terminal of an nth redundancy pixel and a second input terminal of an (n+1)th main pixel. The emission driving circuit of the nth stage may apply the emission control signal to a third input terminal of the nth main pixel and a third input terminal of the nth redundancy pixel.

Each of the main pixel and the redundancy pixel may comprise a driving transistor, a first switching transistor, a second switching transistor, an emission control transistor, a first initializing transistor and a second initializing transistor. In the first switching transistor, a data voltage may be input to a first electrode, a second electrode may be connected to a first node, and a first input terminal may be connected to a gate electrode. In the driving transistor, a pixel-high voltage may be applied to a first electrode, a second electrode may be connected to a third node, and a gate electrode may be connected to a second node. In the second switching transistor, a first electrode may be connected to the third node, a second electrode may be connected to the second node, and a gate electrode may be connected to the first input terminal. In the emission control transistor, a first electrode may be connected to the third node, a second electrode may be connected to an LED, and a gate electrode may be connected to the third input terminal. In the first initializing transistor, an initializing voltage may be applied to a first electrode, a second electrode may be connected to the third node, and a gate electrode may be connected to the second input terminal. In the second initializing transistor, the initializing voltage may be applied to a first electrode, a second electrode may be connected to the first node, and the third input terminal may be connected to a gate electrode.

The display device may further comprise a data driver supplying a data signal to each of the plurality of unit pixels; wherein the plurality of unit pixels and the gate driver is disposed on an upper surface of the display panel, and wherein the data driver is disposed on a lower surface of the display panel.

The main pixel may comprise a red main pixel, a green main pixel and a blue main pixel. The redundancy pixel may comprise a red redundancy pixel, a green redundancy pixel and a blue redundancy pixel. The gate driver may be disposed between two of the red main pixel, the green main pixel and the blue main pixel or between two of the red redundancy pixel, the green redundancy pixel and the blue redundancy pixel.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

The invention claimed is:

1. A display device comprising:
a plurality of unit pixels comprising a main pixel and a redundancy pixel which emit a same color, the main pixel comprising a red main pixel, a green main pixel, and a blue main pixel, and the redundancy pixel comprising a red redundancy pixel, a green redundancy pixel, and a blue redundancy pixel; and
a gate driver integrated in each of the plurality of unit pixels, the gate driver comprising a plurality of stages and the gate driver disposed between two of the red main pixel, the green main pixel, and the blue main pixel or between two of the red redundancy pixel, the green redundancy pixel, and the blue redundancy pixel,
wherein each of the plurality of stages comprises a scan driving circuit for outputting a first scan signal and a second scan signal, and an emission driving circuit for outputting an emission control signal,
wherein an output timing of the first scan signal supplied to the main pixel is same as an output timing of the first scan signal supplied to the redundancy pixel, and
wherein an output timing of the second scan signal supplied to the main pixel is different from an output timing of the second scan signal supplied to the redundancy pixel.

2. The display device of claim 1, wherein the scan driving circuit of nth stage among the plurality of stages comprises:
a Q-node controller for controlling a voltage of a Q-node;
a QB-node controller for controlling a voltage of a QB-node;
a first scan output unit for outputting the first scan signal according to the voltage of the Q-node and the voltage of the QB-node; and
a second scan output unit for outputting the second scan signal according to the voltage of the Q-node and the voltage of the QB-node.

3. The display device of claim 2, wherein the Q-node controller comprises a T1 transistor, a T2 transistor, and a T3 transistor,
wherein in the T1 transistor, a second scan signal of an (n−1)th stage or a gate start signal is applied to a gate electrode of the T1 transistor, a gate-low voltage is applied to a first electrode of the T1 transistor, and a second electrode of the T1 transistor is connected to the T2 transistor,
wherein in the T2 transistor, the second scan signal of the (n−1)th stage or the gate start signal is applied to a gate electrode of the T2 transistor, a first electrode of the T2 transistor is connected to the T1 transistor, and a second electrode of the T2 transistor is connected to the Q-node, and
wherein in the T3 transistor, a gate electrode of the T3 transistor is connected to the QB-node, a gate-high voltage is applied to a first electrode of the T3 transistor, and a second electrode of the T3 transistor is connected to the Q-node,
wherein n is a natural number.

4. The display device of claim 3, wherein the QB-node controller comprises a T4 transistor, a T5 transistor, and a T8 transistor,
wherein in the T4 transistor, a carry clock signal is applied to a gate electrode of the T4 transistor, a gate-low voltage is applied to a first electrode of the T4 transistor, and a second electrode of the T4 transistor is connected to the QB-node,
wherein in the T5 transistor, a second scan signal of the (n−1)th stage or a gate start signal is applied to a gate electrode of the T5 transistor, a gate-high voltage is applied to a first electrode of the T5 transistor, and a second electrode of the T5 transistor is connected to the QB-node, and
wherein in the T8 transistor, a gate electrode of the T8 transistor is connected to the Q-node, the gate-high voltage is applied to a first electrode of the T8 transistor, and a second electrode of the T8 transistor is connected to the QB-node.

5. The display device of claim 2, wherein the emission driving circuit of an nth stage among the plurality of stages comprises a QE-node controller for controlling a voltage of a QE-node and an emission output unit for outputting the emission control signal by a voltage of the QE-node and wherein n is a natural number.

6. The display device of claim 5, wherein the QE-node controller comprises a T10 transistor and a T11 transistor,
wherein in the T10 transistor, a carry clock signal is applied to a gate electrode of the T10 transistor, an emission-low voltage is applied to a first electrode of the T10 transistor, and a second electrode of the T10 transistor is connected to the QE-node, and
wherein in the T11 transistor, a second scan signal of an (n−1)th stage or a gate start signal is applied to a gate electrode of the T11 transistor, an emission-high voltage is applied to a first electrode of the T11 transistor, and a second electrode of the T11 transistor is connected to the QE-node.

7. The display device of claim 1, wherein the scan driving circuit of an nth stage among the plurality of stages applies the second scan signal to the scan driving circuit and the emission driving circuit of an (n+1)th stage, and wherein n is a natural number.

8. The display device of claim 1, wherein each of the main pixel and the redundancy pixel comprises a first input terminal, a second input terminal and a third input terminal,
wherein the scan driving circuit of an nth stage among the plurality of stages applies the first scan signal to a first input terminal of an nth main pixel and a second input terminal of an nth redundancy pixel, and applies the second scan signal to a first input terminal of an nth redundancy pixel and a second input terminal of an (n+1)th main pixel,
wherein the emission driving circuit of the nth stage applies the emission control signal to a third input terminal of the nth main pixel and a third input terminal of the nth redundancy pixel, and
wherein n is a natural number.

9. The display device of claim 1, wherein each of the main pixel and the redundancy pixel comprises a driving transistor, a first switching transistor, a second switching transistor, an emission control transistor, a first initializing transistor, and a second initializing transistor, wherein in the first switching transistor, a data voltage is input to a first electrode of the first switching transistor, a second electrode of the first switching transistor is connected to a first node, and a first input terminal is connected to a gate electrode of the first switching transistor, wherein in the driving transistor, a pixel-high voltage is applied to a first electrode of the driving transistor, a second electrode of the driving transistor is connected to a third node, and a gate electrode of the driving transistor is connected to a second node, when in the second switching transistor, a first electrode of the second switching transistor is connected to the third node, a second electrode of the second switching transistor is connected to the second node, and a gate electrode of the second switching transistor is connected to the first input terminal, wherein in the emission control transistor, a first electrode of the emission control transistor is connected to the third node, a second electrode of the emission control transistor is connected to a light emitting diode, and a gate electrode of the emission control transistor is connected to a third input terminal, wherein in the first initializing transistor, an initializing voltage is applied to a first electrode of the first initializing transistor, a second electrode of the first initializing transistor is connected to the third node, and a gate electrode of the first initializing transistor is connected to a second input terminal, and wherein in the second initializing transistor, the initializing voltage is applied to a first electrode of the second initializing transistor, a second electrode of the second initializing transistor is connected to the first node, and the third input terminal is connected to a gate electrode of the second initializing transistor.

10. The display device of claim 1, further comprising:
a data driver supplying a data signal to each of the plurality of unit pixels;
wherein the plurality of unit pixels and the gate driver is disposed on an upper surface of a display panel, and
wherein the data driver is disposed on a lower surface of the display panel.

11. The display device of claim 9, further comprising:
a storage capacitor disposed between the first node and the second node, wherein the storage capacitor stores a voltage applied to the gate electrode of the driving transistor.

12. The display device of claim 3, wherein the scan driving circuit of nth stage further comprises a plurality of capacitors,
wherein the plurality of capacitors include a first bootstrap capacitor that is connected between the Q-node and a first scan output unit terminal of the first scan output unit for boosting the voltage at the Q-node, a second bootstrap capacitor that is connected between the Q-node and a second scan output unit terminal of the second scan output unit for boosting the voltage at the Q-node, and a second capacitor that is connected between the QB-node and the gate-high voltage for stabilizing the QB-node.

13. The display device of claim 2, wherein the first scan output unit includes a transistor that pulls up the first scan signal, and a transistor that pulls down the first scan signal, wherein the second scan output unit includes a transistor that pulls up the second scan signal, and a transistor that pulls down the second scan signal.

14. The display device of claim 5, wherein the emission driving circuit of nth stage further comprises a third capacitor that is connected between the QE-node and an emission output unit terminal of the emission driving circuit for boosting the voltage at the QE-node.

15. The display device of claim 6, wherein the emission output unit includes a transistor that pulls up the emission control signal, and a first transistor, and a second transistor that pull down the emission control signal,
wherein the emission driving circuit of nth stage further comprises a T12 transistor which is connected between the emission-low voltage and a fourth node for charging the fourth node in response to the voltage of an emission output unit terminal of the emission driving circuit, wherein the fourth node is located between the first transistor and the second transistor.

16. A display device comprising:
a plurality of unit pixels comprising a main pixel and a redundancy pixel which emit a same color, each of the main pixel and the redundancy pixel comprising a first input terminal, a second input terminal and a third input terminal; and
a gate driver integrated in each of the plurality of unit pixels, the gate driver comprising a plurality of stages,
wherein each of the plurality of stages comprises a scan driving circuit for outputting a first scan signal and a second scan signal, and an emission driving circuit for outputting an emission control signal,
wherein an output timing of the first scan signal supplied to the main pixel is same as an output timing of the first scan signal supplied to the redundancy pixel, and
wherein an output timing of the second scan signal supplied to the main pixel is different from an output timing of the second scan signal supplied to the redundancy pixel,
wherein the scan driving circuit of an nth stage among the plurality of stages applies the first scan signal to a first input terminal of an nth main pixel and a second input terminal of an nth redundancy pixel, and applies the second scan signal to a first input terminal of an nth redundancy pixel and a second input terminal of an (n+1)th main pixel,
wherein the emission driving circuit of the nth stage applies the emission control signal to a third input terminal of the nth main pixel and a third input terminal of the nth redundancy pixel, and
wherein n is a natural number.

* * * * *